United States Patent
Kido et al.

(10) Patent No.: US 7,224,602 B2
(45) Date of Patent: May 29, 2007

(54) SEMICONDUCTOR MEMORY DEVICE AND CONTROL METHOD HAVING DATA PROTECTION FEATURE

(75) Inventors: Kazunari Kido, Kanagawa (JP); Minoru Yamashita, Kanagawa (JP); Kazuhiro Kurihara, Tokyo (JP); Atsushi Hatakeyama, Tokyo (JP); Hiroaki Wada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 79 days.

(21) Appl. No.: 11/126,869

(22) Filed: May 11, 2005

(65) Prior Publication Data

US 2005/0276125 A1 Dec. 15, 2005

Related U.S. Application Data

(63) Continuation of application No. PCT/JP2004/06266, filed on May 11, 2004.

(51) Int. Cl.
G11C 11/34 (2006.01)
G11C 16/04 (2006.01)

(52) U.S. Cl. .................. 365/185.04; 365/195

(58) Field of Classification Search ........... 365/185.04, 365/185.11, 185.29, 185.33, 94, 191, 195, 365/195 X, 230.06, 185.04 O
See application file for complete search history.

(56) References Cited

U.S. PATENT DOCUMENTS

| 5,673,222 | A | * | 9/1997 | Fukumoto et al. | ...... 365/185.04 |
| 6,490,197 | B1 | | 12/2002 | Fasoli | ................... 365/185.04 |
| 7,085,158 | B2 | * | 8/2006 | Jeon et al. | ............ 365/185.04 |
| 2003/0117844 | A1 | | 6/2003 | Kawamata | ............. 365/185.04 |

FOREIGN PATENT DOCUMENTS

| JP | 10-188577 A | 7/1998 |
| JP | 11-120781 A | 4/1999 |
| JP | 2001-319484 A | 11/2001 |

* cited by examiner

*Primary Examiner*—VanThu Nguyen

(57) ABSTRACT

A semiconductor device includes a first memory cell array that includes memory cells for storing data and is managed on a sector basis, a second memory cell array including memory cells storing sector protection information on the sector basis, and a control circuit checking the sector protection information stored in the second memory cell array whenever the sector to be programmed or erased is selected. Thus, the sector protection information in all the sectors does not have to be latched at the time of power on. The latch circuit equal in number to the sector does not have to be provided. It is thus possible to reduce the number of the circuits drastically and the chip area can be reduced.

25 Claims, 29 Drawing Sheets

FIG . 26

|  | IO0 | | | IO8 | | | IO1-7, 9-15 | | |
|---|---|---|---|---|---|---|---|---|---|
|  | page0-7 | | | page0-7 | | | page0-7 | | |
| row¥column | 0000 | ... | 0100 | 0000 | ... | 0100 | 0000 | ... | 0100 |
| X | Not Used | | | Not Used | | | Not Used | | |
| X | Not Used | | | Not Used | | | Not Used | | |
| 00 | WP | | | WP | | | Not Used | | |
| 01 | WP | | | WP | | | Not Used | | |
| 10 | WP | | | WP | | | Not Used | | |
| 11 | WP | | | WP | | | Not Used | | |
| X | Not Used | | | Not Used | | | Not Used | | |
| X | Not Used | | | Not Used | | | Not Used | | |

SEMICONDUCTOR MEMORY DEVICE AND CONTROL METHOD HAVING DATA PROTECTION FEATURE

CROSS REFERENCE TO RELATED APPLICATIONS

This is a continuation of International Application No. PCT/JP2004/006266, filed May 11, 2004.

BACKGROUND OF THE INVENTION

1. Field of the Invention

The present invention relates to semiconductor devices and control methods of the semiconductor devices, and more particularly, to a semiconductor device having sector protection information and a control method of the semiconductor device.

2. Description of the Related Art

A flash memory, which is a non-volatile semiconductor memory, respectively performs operations in response to control commands applied from the outside such as read, program, and erase. In particular, an erase command includes a chip erase that erases all the sectors in a memory region and a sector erase that erases a designated sector. The memory region is composed of multiple sectors, and each of the sectors includes multiple memory cells. The flash memory is the non-volatile memory, and stores contents that have to be retained for a long period such as programs and control data in a system.

Accordingly, the flash memory includes a protect memory that stores protection information so as not to erase the aforementioned contents mistakenly. A memory corresponding to each sector stores the protection information and unprotection information. The protection information prohibits erasing of the sector. The unprotection information allows erasing of the sector. Before one sector is erased based on the erase command, the protection information of the protect memory corresponding to the sector is checked. Only the sector of an unprotection status is erased.

FIG. 1 is a diagram illustrating an erase operation in a conventional flash memory. A conventional flash memory 701 includes a memory cell array 702, a WP (write protect) cell array 703, latch circuits L000 through L511. The memory cell array 702 includes a memory cell in which the data is stored, and is divided into multiple sectors S000 through S511. Here, an example will be given of the memory cells divided into 512 sectors. The WP sell array 703 includes multiple non-volatile memory cells that store the protection information corresponding to each of the abovementioned sectors. The protection information shows protect or unprotect of the sector. The latch circuits L000 through L511 are provided to be equal in number to the sectors. For example, the flash memory having 512 sectors therein includes 512 latch circuits. The erase operation shown in FIG. 1 is performed by a control circuit (not shown).

The WP cell array 703 is read to retain the protection information in the latch circuits L000 through L511, making use of a read time at the time of power-on. If the protection information of the latch circuit L511 has the unprotection status when a user enters and performs the chip erase and the sector thereof is not to be erased, the control circuit decrements a sector address counter according to a decrement signal, decrements a sector address, and shifts to the next sector for erase operation.

When the control circuit detects that the protection information of the latch circuit has the protection status, the control circuit does not perform erasing in the sector, decrements a sector address counter according to a decrement signal, decrements a sector address, and shifts to the next sector for erase operation. In the next sector, the control circuit checks the protection information. If the protection information shows the unprotection status, the erase operation is performed. If the protection information shows the protection status, the erase operation is skipped. If the protection information of the latch circuit L256 shows the unprotection status, the control circuit applies an erase stress to the selected sector S256 and the erasing is performed.

After the erasing is completed, the control circuit supplies the decrement signal to decrement the sector address counter. Also in the sector S000, when the control circuit detects that the protection information of the latch circuit L000 shows the protection status, the control circuit completes the procedure without erasing the sector S000.

FIG. 2 is a timing chart at the time of powering on a power VCC in the conventional flash memory. This example shows an input signal for reading at the time of power-on. A signal VCCOK is an internal signal and becomes High, when the power VCC reaches a given level. After the power VCC is powered on, a reset signal RST is changed from High to Low. The period of 1 ms for setting the reset signal RST to High is set to the read time of the protection information from the WP cell array 703. Therefore, the protection information of the WP cell array 703 has to be read into the 512 latch circuits L000 through L511 within 1 ms.

However, the conventional flash memory 701 has a problem in that the read time has to be created at the time of power-on and the latch circuit equal in number to the sectors is required. This is because, at the read time of power-on, the WP cell array 703 is read, the protection information is stored in the latch circuits L000 through L511, and the sector address is sequenced to check the protection information and erase the sector.

SUMMARY OF THE INVENTION

The present invention has been made in view of the above circumstances and has an object of providing a semiconductor device and a control method of the semiconductor device in which a read-time of sector protection information is not necessary at the time of power-on and the latch circuit equal in number to the sector does not have to be provided.

According to an aspect of the present invention, preferably, there is provided a semiconductor device including a first memory cell array that includes memory cells for storing data and is managed on a sector basis; a second memory cell array including memory cells storing sector protection information on the sector basis; and a control circuit checking the sector protection information stored in the second memory cell array when a sector is to be modified. The sector protection information of all the sectors does not have to be latched. The latch circuits equal in number to the sectors do not have to be installed. It is thus possible to reduce the number of the circuits drastically and reduce the chip area. Also, the read time of the sector protection information does not have to be provided at the time of power on.

The semiconductor device may further include a latch circuit that is commonly provided to sectors and stores the sector protection information read from the second memory cell array. Every sector does not have to be equipped with the latch circuit. The circuit structure can be simplified.

On the semiconductor device, the control circuit may read the sector protection information from the second memory cell array by using a wait time after a given command is applied to the control circuit when a sector is to be modified. This can realize programming or erasing for the period same as a conventional example. Also, the read time of the sector protection information does not have to be provided at the time of power on.

On the semiconductor device, the control circuit may perform erasing on the basis of the sector protection information read from the second memory cell array.

On the semiconductor device, the control circuit may delay the timing of polling when reading the sector protection information from the second memory cell array. When the sector information of the second memory cell array is read, the amplifier circuit has to be operated. Delaying the polling timing can prevent the output noise from affecting the sense output.

The semiconductor device may further include an output terminal, and a route from the second memory cell array to the output terminal has a portion shared by a route from the first memory cell array to the output terminal. Thus, the access time of reading the sector protection information can be made equal to that of reading the normal cell.

On the semiconductor device, the memory cells of the second memory cell array may be assigned to a domain corresponding to a terminal via which the sector protection information is output to an outside of the semiconductor device. Thus, the access time of reading the sector protection information can be made equal to that of reading the normal cell.

On the semiconductor device, the second memory cell array may be disposed on an extension of a sector array of the first memory cell array. The signal line for selecting the memory cell in the first memory cell array can be partially used for selecting the memory cell in the second memory cell array.

The semiconductor device may further include signal lines for selecting memory cells in the first memory cell array, and the signal lines include a signal line used to select one of the memory cells in the second memory cell array. The signal line for selecting the first memory cell can be shared by the second memory cell.

The semiconductor device may further include means for selecting memory cells in the first memory cell array, wherein the means for selecting includes a circuit used to select one of the memory cells in the second memory cell array. Thus, the number of times can be reduced.

The semiconductor device may further include a write circuit that writes data into the memory cells of the second memory cell array.

The semiconductor device may further include a third memory cell array including one-time programmable memory cells. Special data can be programmed in the one-time programmable memory cells.

On the semiconductor device, the third memory cell array may be disposed on an extension of a sector array of the first memory cell array. The signal used for selecting the memory cell in the first memory cell array can be used for selecting the memory cell in the second memory cell array.

On the semiconductor device, the third memory cell array may be provided on a sector array different from that of the second memory cell array. The word line is not selected simultaneously.

The semiconductor device may further include signal lines for selecting memory cells of the first memory cell array, wherein the signal lines include a signal line used to select one of the one-time programmable memory cells of the third memory cell array. The select signal of the memory cell can be commonly used.

The semiconductor device may include mans for selecting memory cells in the first memory cell array, wherein the means for selecting includes a circuit used to select one of the one-time programmable memory cells in the third memory cell array. Thus, the number of the circuits can be reduced.

The semiconductor device may further include global word lines shared by selection of the memory cells in the second memory cell array and selection of one of the one-time programmable memory cells in the third memory cell array. The circuits and the signal lines can be reduced and simplified.

The semiconductor device may further include a volatile memory circuit storing another sector protection information on the sector basis; and a circuit part selectively outputting the sector protection information in the second memory cell array and said another sector protection information in the volatile memory circuit. When the sector protection information is read from the second memory cell array, the sector protection information of the volatile memory device is read at the same time. One of the sector protection information can be output selectively.

On the semiconductor device, the circuit part may select said another sector protection information in the volatile memory circuit when said another sector protection information shows protection of data in the first memory cell array. The volatile memory is made of logic circuits, and it is dramatically faster than reading the memory cell from the second memory cell array. Thus, there is no delay in reading the sector protection information.

On the semiconductor device, the circuit part may select the sector protection information in the second memory cell array when said another sector protection information in the volatile memory circuit shows unprotection of data in the first memory cell array. There is no delay in reading.

On the semiconductor device, the circuit part may include an output inversion circuit that inverts the sector protection information selected. Thus, the sector protection information can be distinguished.

According to another aspect of the present invention, preferably, there is provided a semiconductor device including: a first memory cell array that includes memory cells for storing data and is managed on a sector basis; a second memory cell array including memory cells storing first sector protection information on the sector basis; a volatile memory circuit storing second sector protection information on the sector basis; and a circuit part selectively outputting the first and second protection information. The circuits and the layout are standardized to reduce the period for design.

The semiconductor device may further include an address control circuit producing different addresses in a user mode and a test mode so that an assessable domain of the memory cells of the second memory cell array can be changed. With the given user mode and the test mode, the accessible region of the memory cell in the second memory cell array can be changed.

On the semiconductor device, the address control circuit may select, in the user mode, one of the memory cells of the second memory cell array using an address for selecting one of the sectors of the first memory cell array. Only the memory cell array storing the sector protection information in the second memory cell array can be accessed.

On the semiconductor device, the address control circuit may select, in the test mode, one of the memory cells of the second memory cell array using an address for selecting one of the sectors of the first memory cell array. All the memory cells in the second memory cell are accessible.

The semiconductor device may further include a control circuit that provides the address control circuit with a control signal for switching the address used in the address control circuit after receiving a given user command. The semiconductor device may further include a control circuit that provides the address control circuit with a control signal for switching the address used in the address control circuit after receiving a given test command. The semiconductor device may be a semiconductor memory device.

According to another aspect of the present invention, preferably, there is provided a control method including the steps of: checking sector protection information in a second memory cell array on a sector basis of a first memory cell array when a sector is to be modified; detecting a protection status of the sector by referring to the sector protection information read at the step of reading; performing a predetermined process for the first memory cell array on the basis of a detection result. The sector protection information stored in the second memory cell array is read to sense the protection status of the sector. Then, a given procedure is progressed in the first memory cell array such as erase operation. This can eliminate latching the sector protection of all the sectors at the time of power on. Thus, the latch circuit equal in number to the sector does not have to be installed. Thus, the circuits can be reduced drastically and the chip area can be reduced.

On the control method, the step of reading may use a wait time after a given command is input. It is thus possible to realize perform programming or erasing for a period same as the conventional examples. The operation can be performed for the same period of time as the conventional devices. Moreover, the read time of the sector protection information can be eliminated at the time of power on.

According to another aspect of the present invention, preferably, there is provided a control method including the steps of: checking first sector protection information in a second non-volatile memory cell array on a sector basis of a first non-volatile memory cell array; checking second sector protection information from a volatile memory circuit on the sector basis of the first non-volatile memory cell array; and selecting the second sector protection information when the second sector protection information shows protection of the data in the first non-volatile memory cell array. The volatile memory circuit is composed of the logic circuits, and it is dramatically faster than reading the memory cell from the second memory cell array. Thus, there is no delay in reading the sector protection information.

On the control method, the step of selecting may select the first sector protection information rather than the second sector protection information when the second sector protection information shows unprotection of the data in the first non-volatile memory cell array. There is no delay in reading.

In accordance with the present invention, there is provided the semiconductor device and the method for controlling the semiconductor device in which the read time is not required for reading the sector protection information at the time of power on and the latch circuit equal in number to the sector does not have to be installed.

BRIEF DESCRIPTION OF THE DRAWINGS

FIG. 26 shows a configuration example of the WP cell array;

DESCRIPTION OF THE PREFERRED EMBODIMENTS

A description will now be given, with reference to the accompanying drawings, of embodiments of the present invention.

First Embodiment

Figure 1:
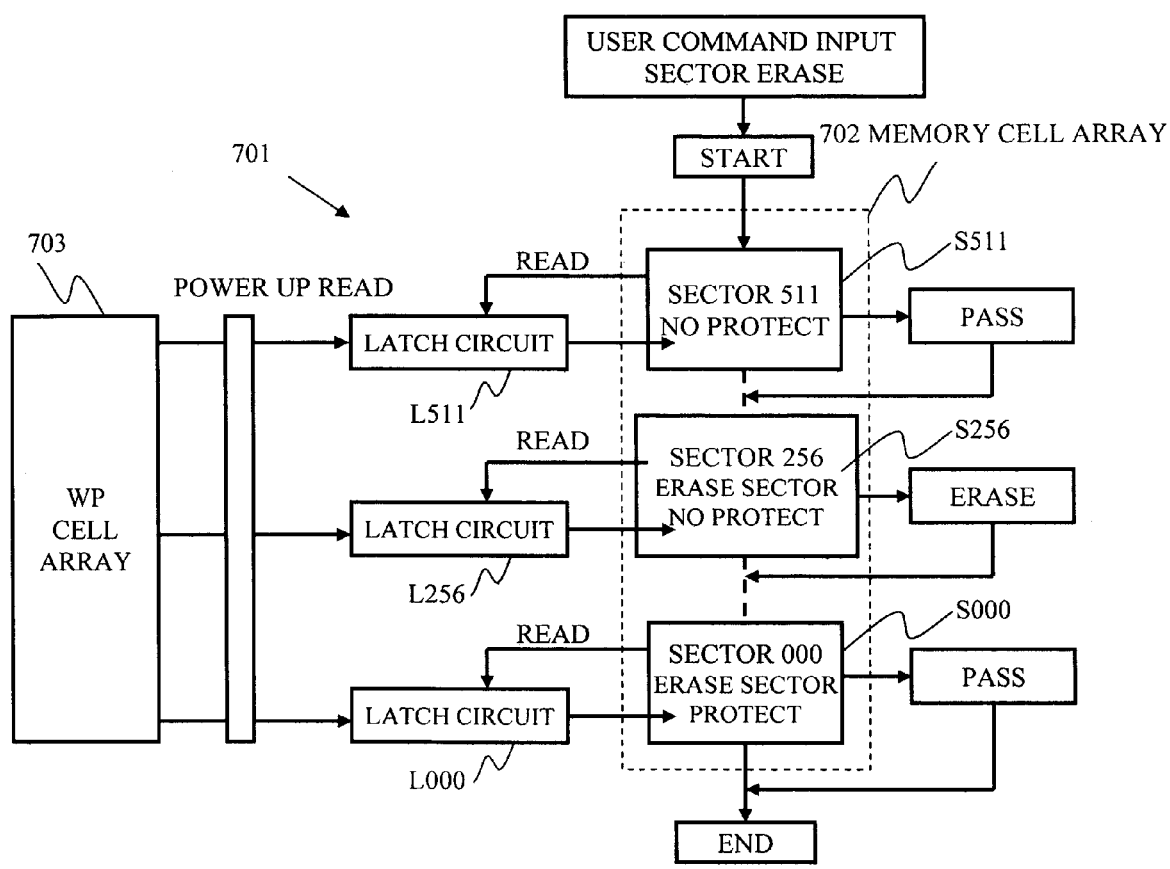
FIG. 1 is a view describing an erase operation in a conventional flash memory.
Figure 2:
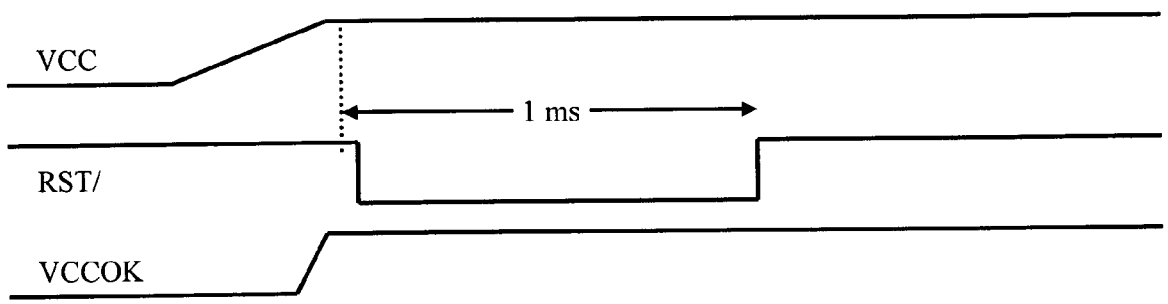
FIG. 2 is a timing chart when a power VCC is powered on in the conventional flash memory.
Figure 3:
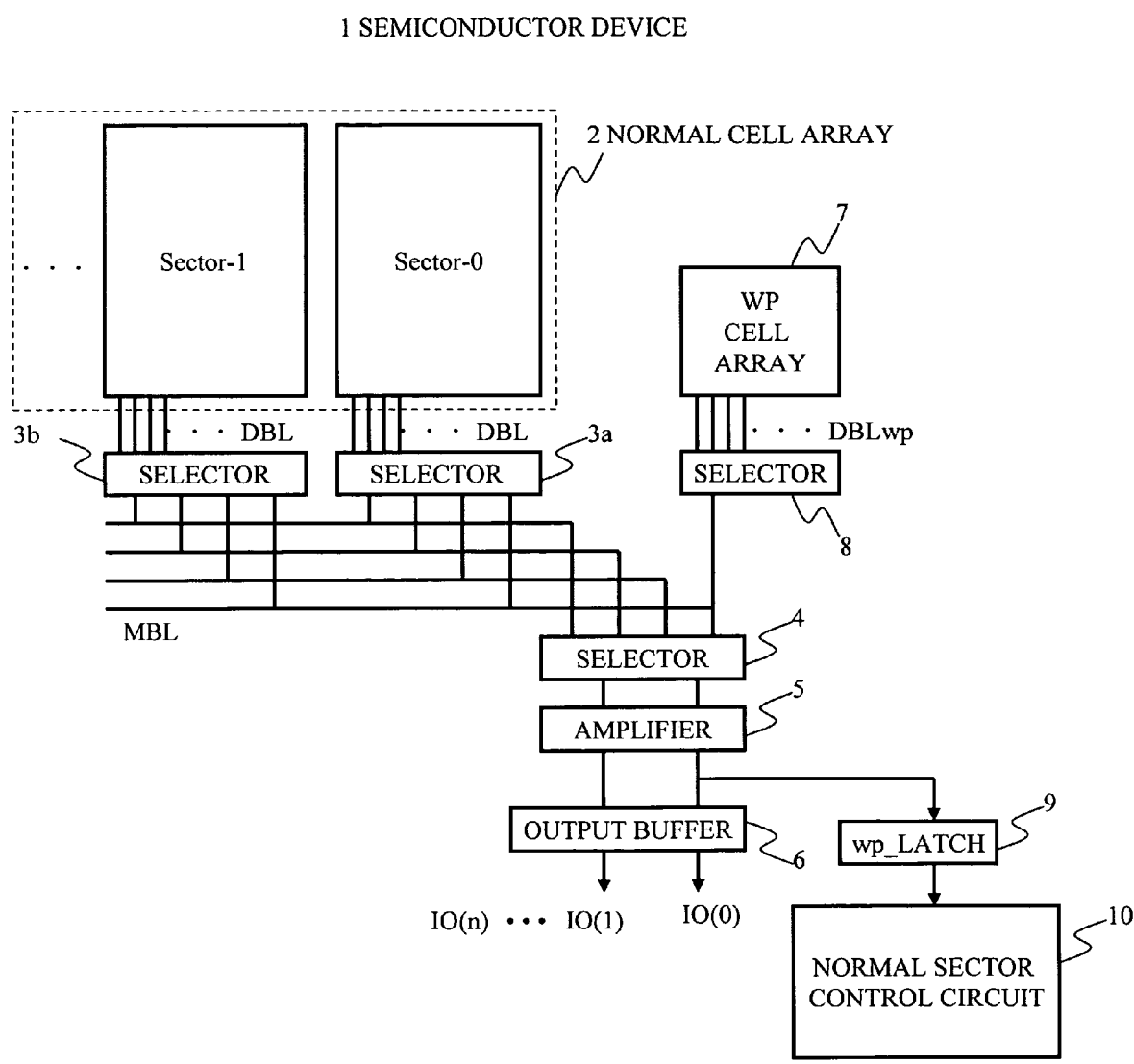
FIG. 3 is a block diagram of a semiconductor device in accordance with a present embodiment.

A description will be given of a first embodiment. FIG. 3 is a block diagram showing a semiconductor device in accordance with the present embodiment. As shown in FIG. 3, a semiconductor device 1 includes a normal cell array 2, selectors 3a through 3n, a selector 4, an amplifier circuit 5, an output buffer 6, a WP cell array 7, a selector 8, a WP latch circuit 9, and a normal sector control circuit 10. The semiconductor device 1 may be a semiconductor memory device such as a single-packaged flash memory or may be incorporated into the semiconductor device such as a system LSI.

The normal cell array 2 includes multiple memory cells for storing data, and is managed on a sector basis of the sectors S0, S1, . . . , and Sn. Normal data from the sectors S1 through Sn is input into selectors 3a through 3n by way of DBL lines in the sectors. Then, the normal data is transmitted to MBL lines shared by the multiple sectors from the selectors 3a through 3n, pass through the selector 4, and is amplified in the amplifier circuit 5. Normal cell data that has been amplified in the amplifier circuit 5 is output from IO terminals IO (n:0) through the output buffer 6.

The WP cell array 7 includes memory cells that store the protection information (sector protection information) for every sector. The protection information read from the WP cell array 7 is transmitted to the MBL lines by way of DBL wp lines in the WP cell array 7 and the selector 8, and is amplified in the amplifier circuit 5 through the selector 4. The protection information amplified by the amplifier circuit 5 is retained in the WP latch circuit 9. The WP latch circuit 9 retains 1-bit data. Conventionally, the latch circuit for WP equal in number to the sector is provided to correspond to the WP cell array 7. However, in the present embodiment, only one WP latch circuit 9 is provided for the WP cell array 7.

The normal sector control circuit 10 serves as a state machine to control each part of the semiconductor device 1. The normal sector control circuit 10 reads the protection information from the WP cell array 7 making use of the wait time after the command input. The normal sector control circuit 10 reads (checks) the protection status whenever the sector is designated to be programmed or erased, so as to detect the protection status of each sector and perform programming or erasing.

Figure 4:
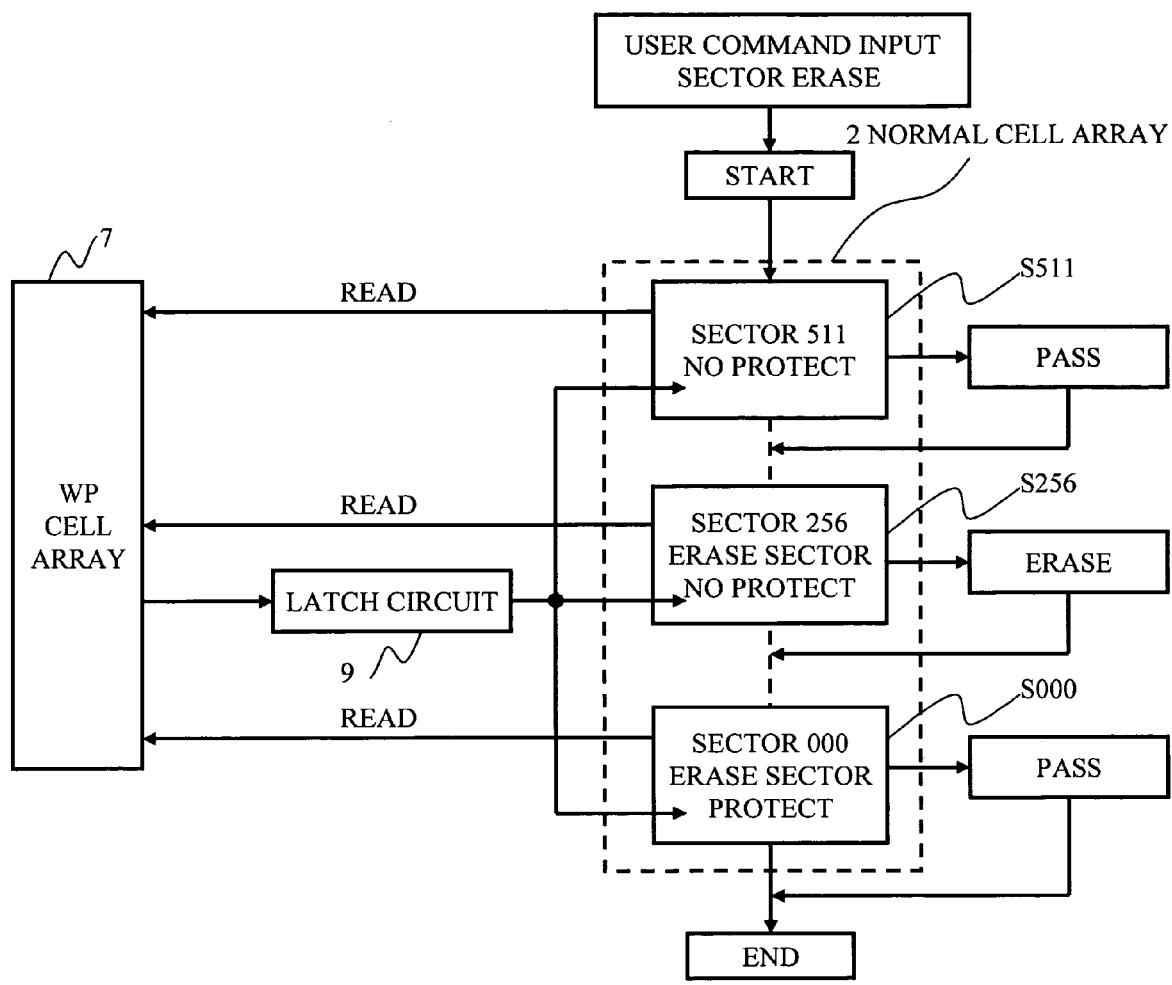
FIG. 4 is a view describing the erase operation in a semiconductor device in accordance with a first embodiment.

Next, a description will now be given of the erase operation of the semiconductor device 1. FIG. 4 is a diagram showing the erase operation in the semiconductor device in the first embodiment. The same components and configurations as those in FIG. 3 have the same reference numerals. A reference numeral 7 indicates the WP cell array. A reference numeral 9 indicates the WP latch circuit. Reference numerals S511 through S000 indicate sectors. The above-mentioned normal sector control circuit 10 controls the erase operation.

After then erase command is entered and the sector address is changed by a sequencer, the protection information of the sector S511 is read from the cell array 7 to retain in the WP latch circuit 9, making use of the wait time necessary for initializing circuits for applying an erasing pulse (such as a charge pump circuit). The normal sector control circuit 10 checks the protection information of the WP latch circuit 9. If the sector S511 is not to be erased, the normal sector control circuit 10 decrements the sector address counter according to the decrement signal, decrements the sector address, and shifts to the next sector for the erasing operation.

Also in the sector S256, the protection information of the sector S256 is read from the WP cell array 7 to retain the WP latch circuit 9 during the wait time. If the normal sector control circuit 10 checks the protection information of the WP latch circuit 9 and confirms the unprotection status, the erase signal is supplied to an erase circuit (not shown) and the erase stress is supplied the selected sector S256. After the erase stress is applied, an erase verification is performed in a verify circuit of the sector S256 (not shown). A verify result signal is supplied to the normal sector control circuit 10.

At the erase verification, unless it is confirmed that all the memory cells in the sector S256 are erased, the above-mentioned erase stress is applied and the erase verification is performed repeatedly. When the erase verification is passed, the normal sector control circuit 10 supplies the decrement signal to decrement the sector address counter. Also in the sector S000, the protection information of the sector S000 is read from the cell array for WP 7 to retain the WP latch circuit 9 during the wait time. If the normal sector control circuit 10 checks the protection information of the WP latch circuit 9 and confirms the protection status, the normal sector control circuit 10 completes the procedure without erasing the sector S000.

Figure 5:
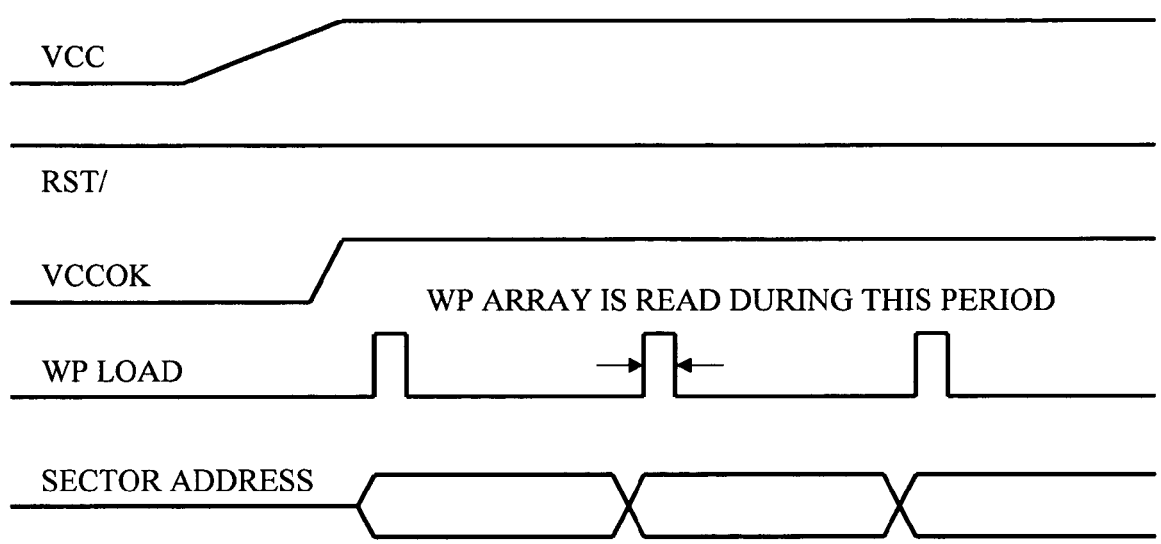
FIG. 5 is a timing chart when a user command is input.

FIG. 5 is a timing chart of the command of erasing/programming input. The signal VCCOK is an internal signal and becomes High, when the power VCC reaches a given level. In the present embodiment, the reset signal RST remains High, because there is not provided the read time for reading the protection information from the WP cell array 7 at the time of power-on. After the signal VCCOK becomes High, the command of erasing/programming is input (not shown) into the normal sector control circuit 10. When the sector is designated to perform erasing/programming internally, a pulse named WPLOAD is generated to load the protection information of the WP latch circuit 9 from the WP cell array 7 during the time.

In this manner, after erasing or programming command is entered, the protection information is read from the WP array to detect the protection status of the sector during the wait time, every time the sector to be erased or programmed is internally designated. Thus, the information to be latched can be put together into one piece of information. Also, the latch circuits for WP can be integrated into one circuit. Also, the WP array is read while erasing/programming command is being input. This can eliminate the read time at the time of power-on. This is different from the conventional examples.

Reading is performed at the time of inputting the user's command. That is, the wait time is utilized before the internal operation starts. Thus, there arises no delay, as compared to the conventional user mode. Thus, programming and erasing can be performed for the period same as the conventional example. Moreover, the number of circuits can be reduced significantly and the chip area can be reduced.

Also, every time the WP cell array 7 is read, and the amplifier circuit 5 needs to be set enable during polling. However, if the amplifier circuit 5 operates at the time of polling, the output noise affects the sense output. Therefore, the normal sector control circuit 10 delays the timing of polling slightly in the user mode when the protection information is read from the WP cell array 7. This can reduce the size of the output transistor. Thus, the noise affection can be reduced.

Now, when the protection information of all the sectors is read to retain in the latch circuit at the time of chip activation, the access time of reading the protection information is not delayed in the conventional example. However, there is a concern in the access time of reading the protection information, because the protection information is read from the WP cell array 7 in each case during the wait time.

In particular, a sense period to read the data in the WP cell, a select period to select the protection information of the sector, and a transmit period to transmit the protection information to the IO terminal are required to transmit the protection information to the outside (protection information read mode). The protection information read mode is prepared so that the user may understand what sector is protected by the WP cell array 7. Therefore, there arises a problem in that the access time is delayed. A description will be given of the semiconductor device that can avoid the aforementioned problem and can make the access time for reading the protection information equal to the access time for normal reading.

A description will be given with reference to FIG. 3 again. The semiconductor device 1 shown in FIG. 3 includes a data path from a WP cell array 7 to an IO terminal IO is partially shared by a data path from a normal cell array 2 to the IO terminal IO. Also the WP cell is assigned to a region corresponding to the IO terminal IO (0) that outputs the protection information at the time of reading the protection information. FIG. 3 shows an example having multiple IO terminals. The normal cell is assigned to correspond to each IO terminal, and the DBL and MBL are assigned to correspond to the respective IO terminals. The protection information is determined to be output from, for example, IO (0), according to the specification of the chip. However, the data in the WP cell array 7 is connected to output to the IO (0) by way of the MBL line corresponding to the IO (0).

First, a description will be given of the operation at the time of reading the normal cell array 1. The data in the normal cell from each of the sectors S1 through Sn enters the selectors 3a through 3n by way of the DBL lines in the sectors S1 through Sn. Then, the data is transmitted to the MBL line shared by the multiple sectors, and is transmitted to the amplifier circuit 5 through the selector 4. The amplifier circuit 5 amplifies the normal cell data. The normal cell data amplified by the amplifier circuit 5 is transmitted to the output buffer 6, and is output form the IO terminal 10 (n:0).

When the protection information is read, the protection information stored in the WP cell is transmitted to the MBL line by way of the DBL wp line in the WP cell array 7 and the selector 8. After thus transmitted, the data passes through the same path as the normal cell data, and is output to the outside. With this configuration, it is possible to make the access time for reading the protection information equal to the access time for normal reading. The memory cell in the WP cell array 7 is assigned to the region corresponding to the terminal that outputs the protection information of the sector when the sector protection information is read. It is thus possible to make the access time for reading the protection information equal to the access time for normal reading.

Figure 6:
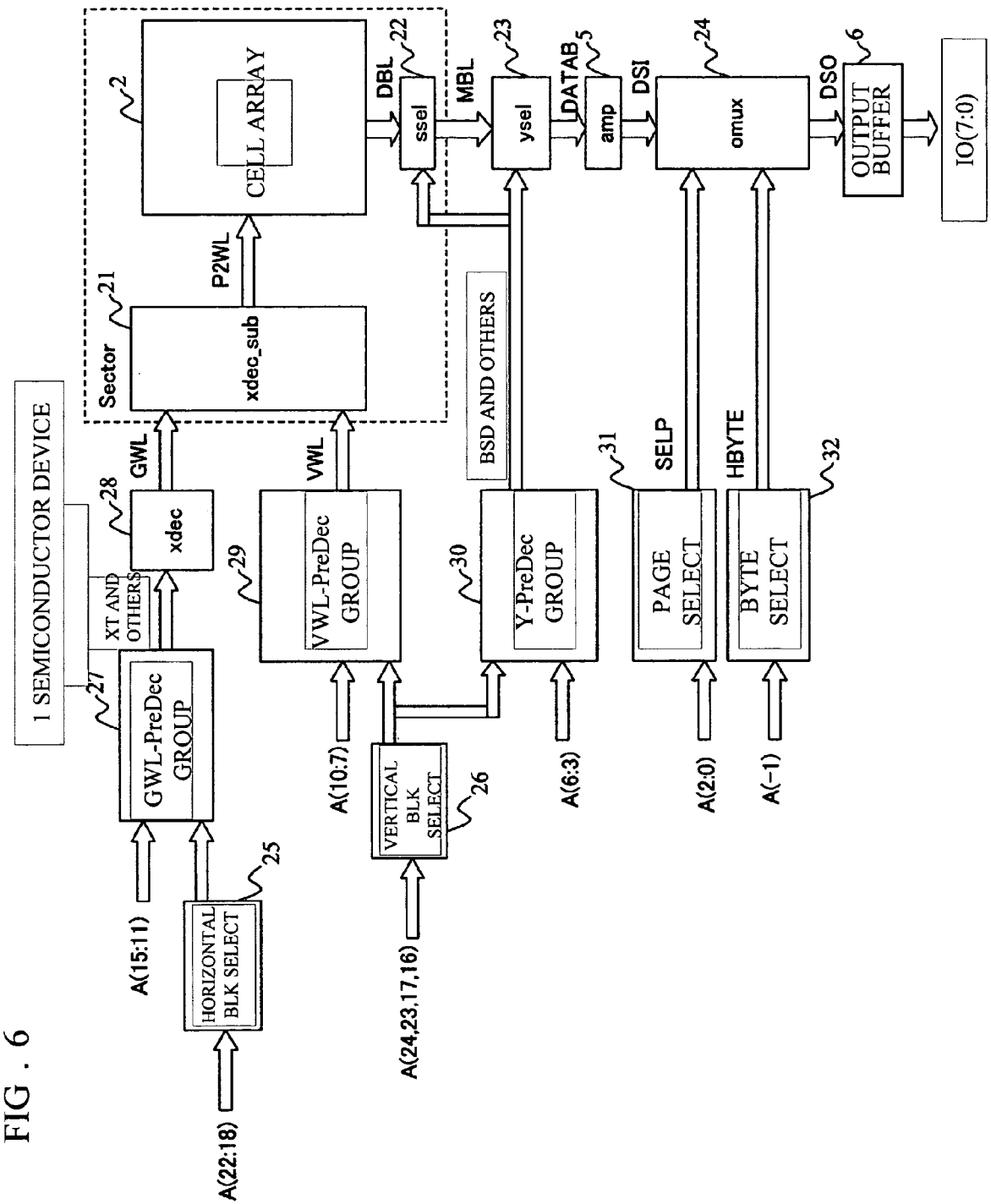
FIG. 6 is a block diagram when a normal cell array is read.

Next, a description will be given with a 512M-bit non-volatile semiconductor memory device. FIG. 6 is a block diagram showing when the normal cell array is read. FIG. 6 also shows the address selection when the normal cell array is read. As shown in FIG. 6, the semiconductor device 1 includes the normal cell array 2, an X sub decoder 21, a decoder (ssel) 22, a Y decoder (ysel) 23, the amplifier circuit 5, an omux circuit 24, the output buffer 6, a horizontal block select circuit 25, a vertical block select circuit 26, a GWL predecoder group 27, an X decoder 28, a VWL predecoder group 29, a Y predecoder group 30, a page select circuit 31, and a byte select circuit 32.

The same components and configurations as those in FIG. 3 have the same reference numerals. The normal cell array 2 is arranged in a matrix of X and Y. The X subdecoder 21 selects a word line P2WL. The decoder 22 selects the bit line DBL. The decoder 23 selects the bit line MBL. The amplifier circuit 5 amplifies the cell data transmitted to a signal line DATAB. There are provided 128 amplifier circuits 5. Eight cells are selected out of 512 M cells by 26 address signals of A(24) through A(0) and A(−1), and stored data are respectively output to the eight IO terminals IO (7:0). Here, the horizontal block select circuit 25 selects a horizontal block with five address signals of A(22) through A(18). The vertical block select circuit 26 selects a vertical block with four address signals of A(24), A(23), A(17), and A(16).

Figure 7:
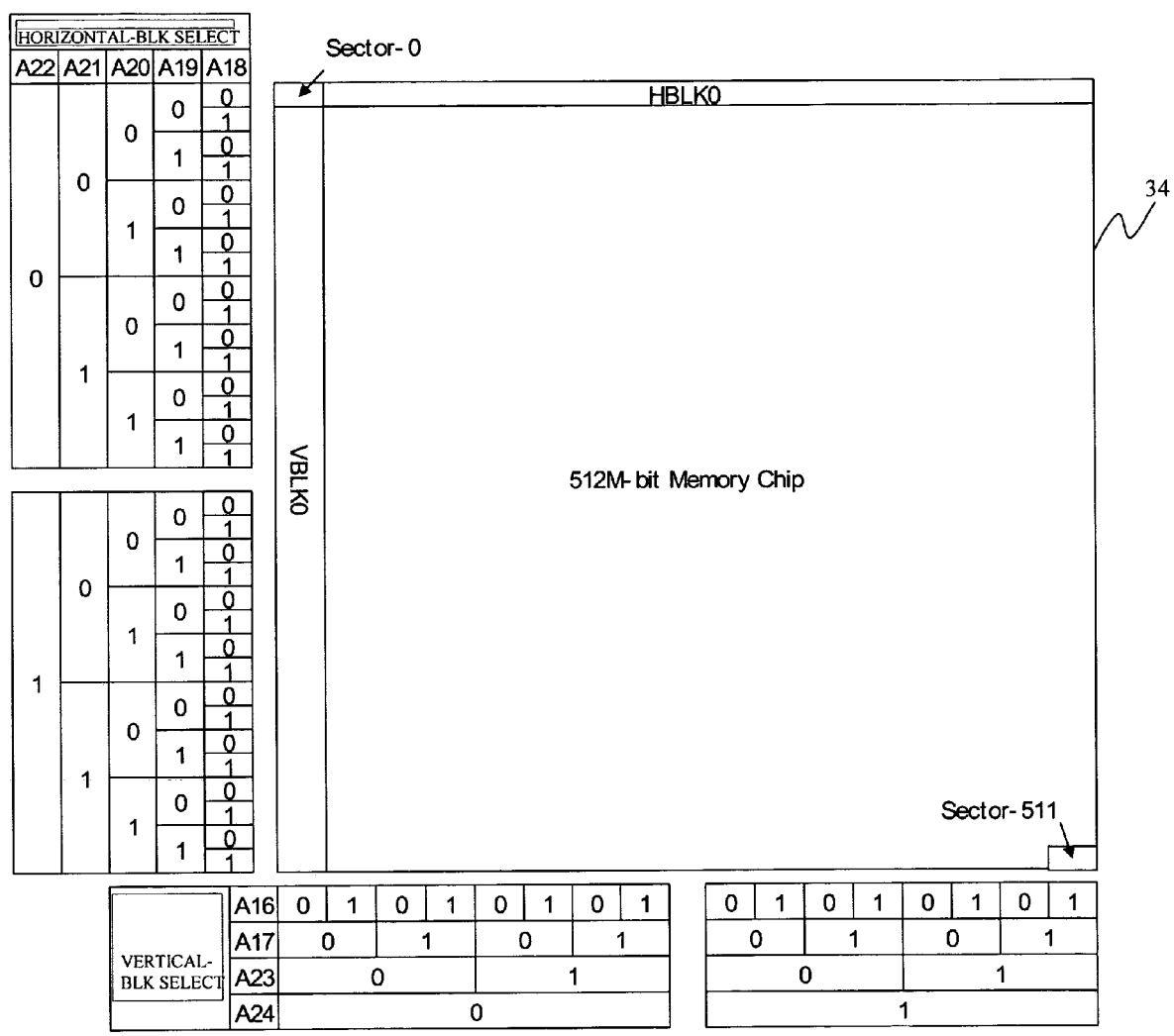
FIG. 7 shows a physical location and an address assignment of horizontal blocks and vertical blocks in a 512M-bit memory chip.

FIG. 7 shows a physical location and an address assignment of the horizontal blocks and vertical blocks in a 512M-bit memory chip. As shown in FIG. 7, the vertical block select circuit 26 selects a vertical block VBLK having a strip shape in a vertical direction. The horizontal block select circuit 25 selects a block in a horizontal direction. FIG. 7 shows addresses to be used for selecting theses blocks. The selected sector is a region overlapped by the selected horizontal block and vertical block. There are 512 sectors of the sector 0 through the sector 511 on the chip in the present embodiment.

Referring back to FIG. 6, the GWL predecoder group 27 selects the word line GWL through the X decoder 28 with the five address signals of A(15) through A(11). The VWL predecoder group 29 selects the word line VWL with the four address signals of A(10) through A(7). The X subdecoder 21 selects the word line P2WL after combining the selected word lines GWL and VWL.

Figure 8:
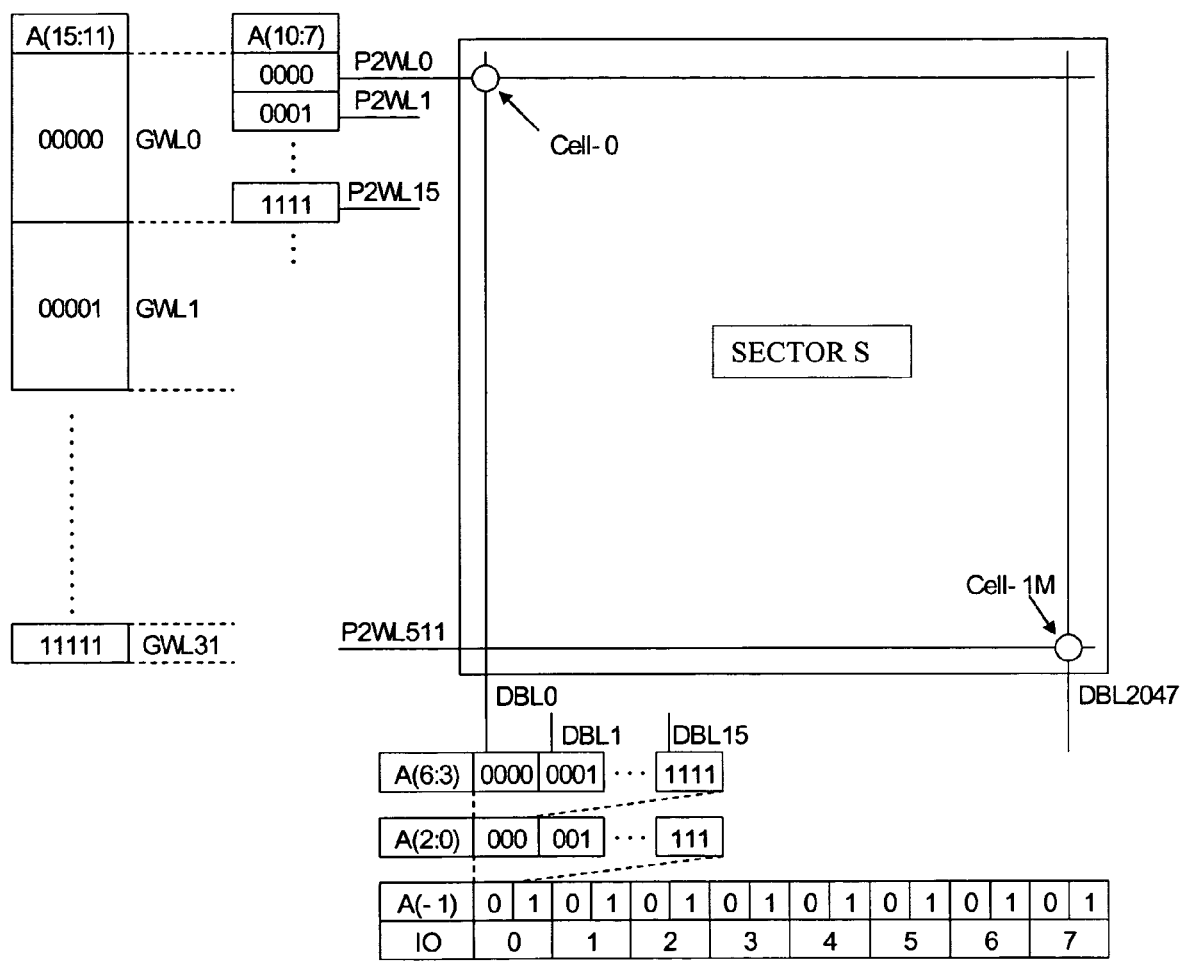
FIG. 8 shows a physical location and an address assignment of word lines GWL and word lines P2WL in the sector.

FIG. 8 shows a physical location and an address assignment of the word lines GWL and the word lines P2WL in the sector. FIG. 8 also shows the physical location of the bit lines DBL in the sector, the addresses of A(6) through A(−1) corresponding to the bit lines DBL, and IO assignments of IO(7) through IO(0). There are provided 512 word lines P2WL in the horizontal direction in a sector S. Cells are arranged on all intersections of the word lines P2WL with the bit lines DBL.

In the present embodiment, there are provided 1 M cells in total on all the intersections of 512 word lines P2WL of P2WL0 through P2WL511 with 2048 bit lines DBL of DBL0 through DBL2047. The cells are hierarchically assigned by addresses A(10:7) and A(15:11). 2048 cells are connected to the selected word lines P2WL, and the data stored in the cells are output to 2048 bit lines DBL.

Referring back to FIG. 6 again, the Y predecoder group 30 selects 128 cell data with the four address signals of A(6) through A(3). Thus selected cell data are transmitted to the 128 DATABs and are amplified by the 128 amplifier circuits 5. Then, the page select circuit 31 and the byte select circuit 32 select eight cell data via the omux circuit 24 by the four address signals of A(2) through A(−1), and outputs the cell data to the IO terminals IO(7) through IO(0).

Figure 9:
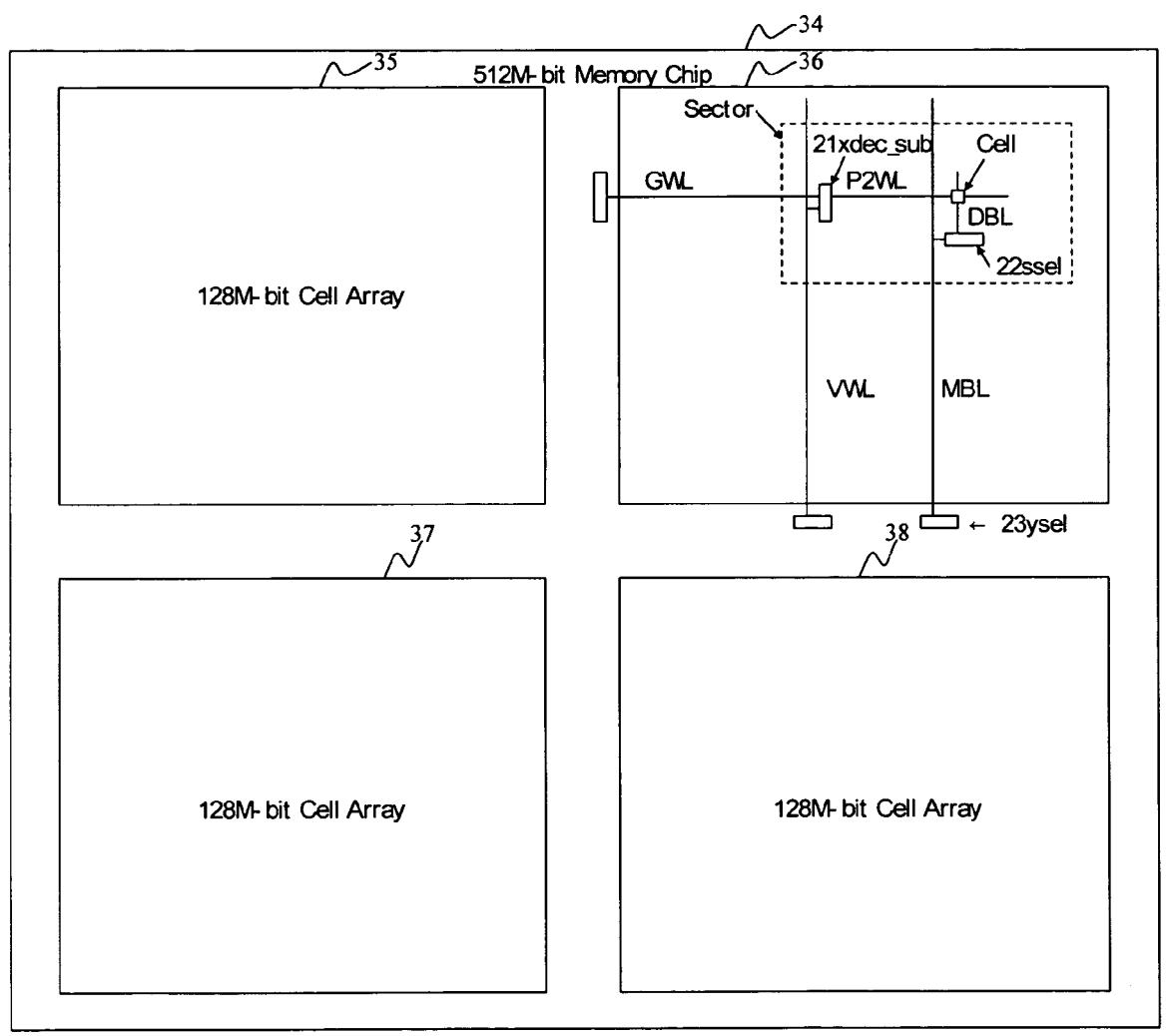
FIG. 9 shows a physical location of main elements out of the circuits and signals shown in the block diagram shown in FIG. 6.

FIG. 9 shows a physical location of main elements of the circuits and signals shown in the block diagram shown in FIG. 6. As shown in FIG. 9, an outmost square shows an image of an entire chip 34. 512 M cell arrays are divided into four cell arrays 35 through 38, each of which includes 128 M cell arrays. A peripheral circuitry is arranged in a periphery of the chip 34 and in a cross region of the 128 M cell arrays 35 through 38. FIG. 9 shows a relative physical relationship of the elements, and the sizes of the elements are arbitrarily and respectively designed.

The word lines GML and VWL are extended to be crossed at right angles to each other from the peripheral circuitry. The word line GWL and the word line P2WL are arranged in the horizontal direction. The word line VWL, the bit line DBL, and the bit line MBL are arranged in the vertical direction. A square indicated by a dotted line denotes one sector S. Here, the size of the sector S is largely enlarged, as compared to the size of the entire chip. In each sector S, the word line GWL and the word line VWL are logically operated by the x subdecoder 21 and the decoder 22 to select one word line. FIG. 9 also shows line directions of the bit line DBL and the bit line MBL. The signal line that selects the memory cell of the normal cell array 2 is partially used for selecting the memory cell of the WP cell array 7.

Figure 10:
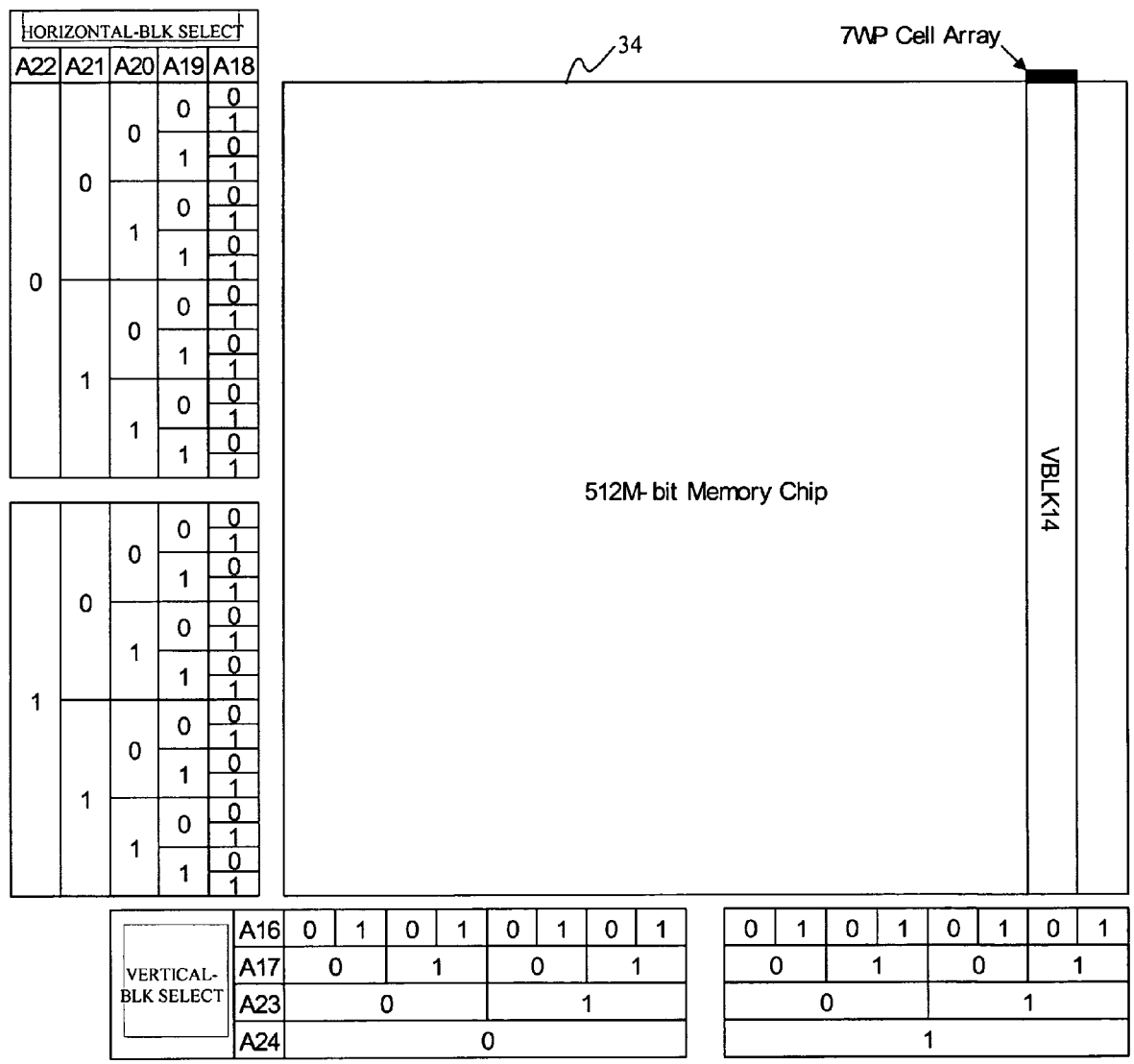
FIG. 10 shows a physical location of a WP cell array.

Next, a description will be given of the physical location of the WP cell array. FIG. 10 shows a physical location of the WP cell array. As shown in FIG. 10, the WP cell array 7 is disposed adjacently to the normal cell array 2. The WP cell array 7 is disposed on an extension of the vertical block VBLK (sector column) of the normal cell array 2. In FIG. 10, the WP cell array 7 is disposed on an upper end of a vertical block VBLK14, which is the second block from the right. With thus disposed cell array, the select signal lines of the normal cell used in the same vertical block can be used for selecting the WP cell.

Figure 11:
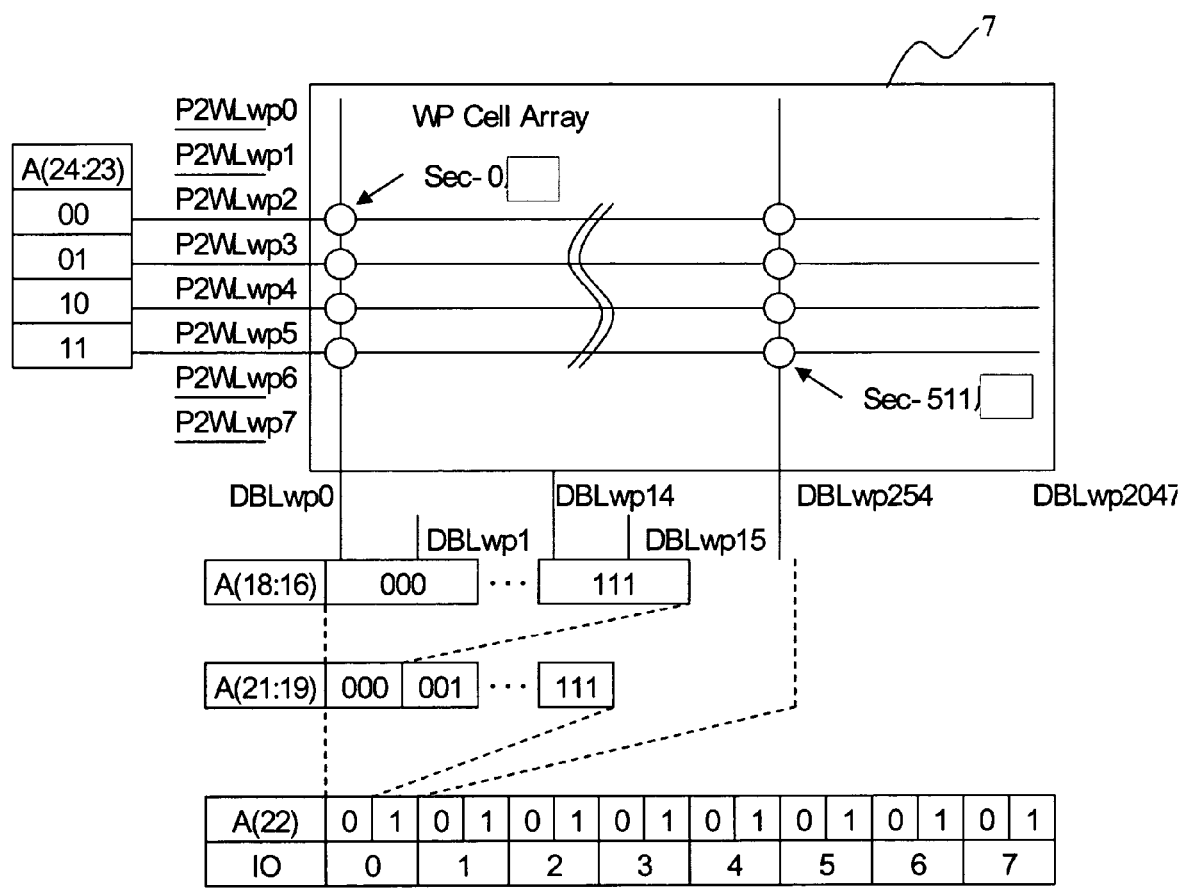
FIG. 11 shows the physical location, address, and IO assignment of the cell in the WP cell array.

FIG. 11 shows the physical location, address, and IO assignment of the cell in the WP cell array 7. FIG. 11 corresponds to FIG. 8 describing the normal cell array 2. The WP cell array 7 includes eight word lines P2WLwp and 2048 bit lines DBLwp, and also includes 16 k cells on the intersections thereof. In the present embodiment, four word lines P2LWLwp2 through P2LWLwp5 are used. Therefore, 512 cells are actually used out of 16 k cells. The WP cell is selected by the sector address. Here, the WP cell is selected with the sector address A(24:16).

Figure 12:
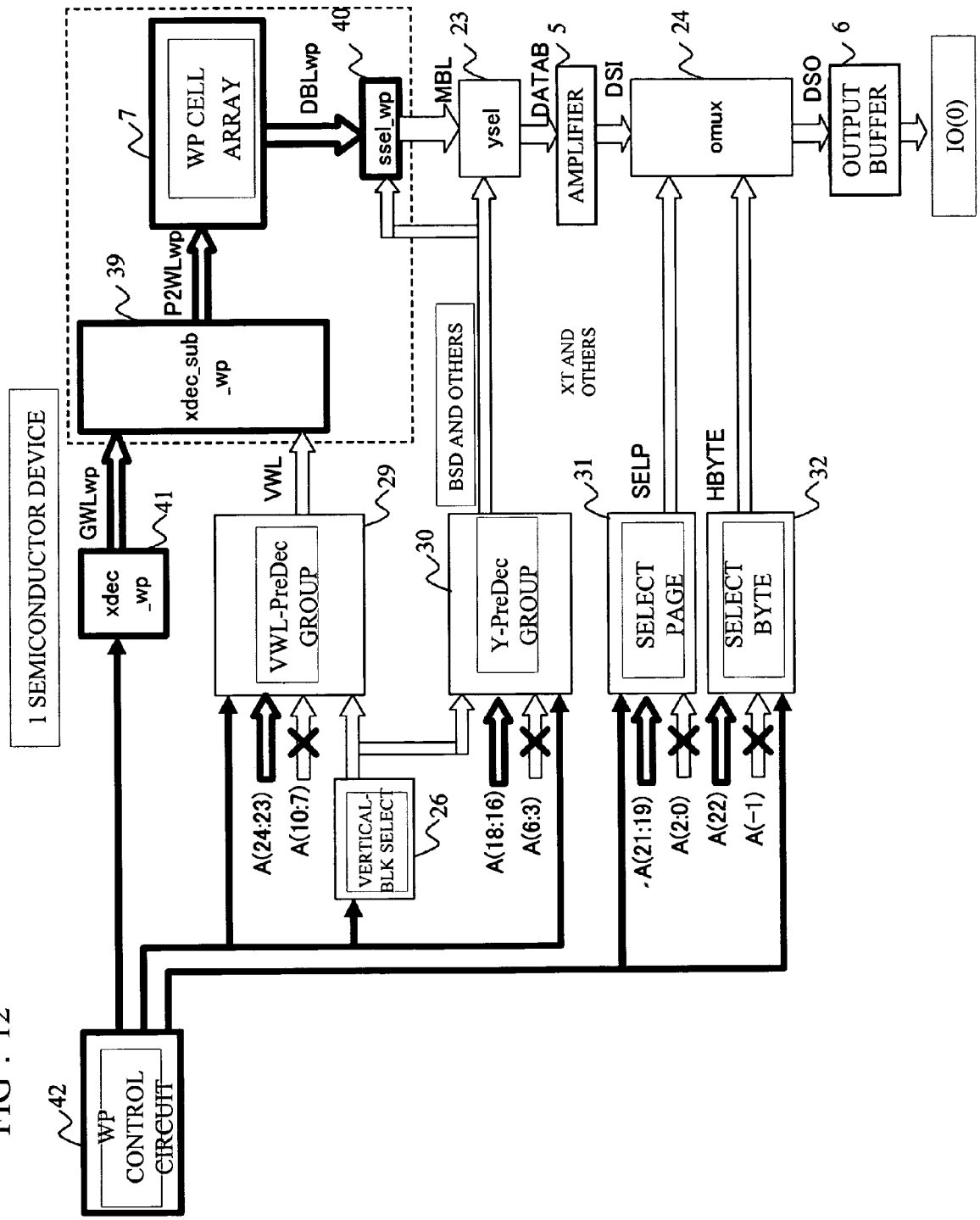
FIG. 12 is a view illustrating the operation when the protection information is externally used.

Next, a description will be given of the operation of reading the protection information. FIG. 12 is a view illustrating the operation when the protection information is externally used. As shown in FIG. 12, the semiconductor device 1 includes a WP control circuit 42, the WP cell array 7, an X subdecoder for WP 39, a decoder (ssl_wp) for WP 40, the decoder (ysel) 23, the amplifier circuit 5, the omux circuit 24, the output buffer 6, an x decoder for wp 41, the vertical block select circuit 26, the VWL predecoder group 29, the Y predecoder group 30, the page select circuit 31, and the byte select circuit 32. The same components and configurations as described above have the same reference numerals and a detailed explanation will be omitted. FIG. 12 includes necessary elements only when the protection information is externally used. The elements surrounded by the thick lines indicate the circuits and signals exclusively used for selecting the WP cell. Except the aforementioned elements, the circuits and signals are used for selecting the normal cells.

The WP control circuit 42, after turning into the protection information read mode, selects the word line GWLwp with the x decoder for wp 41, and selects the word line VWL with the address signals of A(24) and A(23) in the VWL predecoder group 29. The word line GWLwp and the word line VWL are combined in the X subdecoder for wp 39, and the word line P2WLwp is selected. 2048 WP cell are connected to the selected word line P2WLwp. However, 128 cells alternately arranged from the left are used for storing the protection information. That is, the WP cells are connected to even-numbered bit lines out of the bit lines DBLwp0 through DBLwp254.

The data stored there is output to the bit line DBLwp. ⅛ is selected by three address signals of A(18) through A(16), and is transmitted to DATAB. After the data is amplified in the amplifier circuit 5, ¹⁄₁₆ is further selected by four address signals of A(22) through A(19), and is output to the IO(0). Here, it is controlled that a predetermined data according to the specification of reading the protection information is output to the IO(7) through IO(1), for example, 0 data.

The circuits and signals from the bit line MBL to the IO terminal IO(0) have the same path as the data in the normal cell is output to the IO terminal IO(0). Thus, the transmission speed of the WP cell data, namely, the transmission speed of the protection information is equal to that of the normal cell data. The bit DBLwp of the WP cell array 7 is equal to the bit DBL of the normal sector, but is rather shorter. Therefore, the signal transmission is slightly faster, with respect to the select operation with the address signal. The selection of the WP cell is substantially equal to the selection of the normal cell. It is thus possible to make the access speed for reading the protection information equal to that for the normal reading. In other words, the read access time ensured by the device specification is not controlled by the access speed for accessing the WP cell array 7 in the protection information read mode, and the access speed for accessing the normal cell can be made equal to the aforementioned read access time.

The semiconductor device 1 in the present embodiment has the same configuration except the X decoder 28 and the x decoder for wp 41, when reading the normal cell as shown in FIG. 6 and when reading the WP cell as shown in FIG. 12.

The VWL predecoder group 29 selects the word line VWL with the use of the address A(10:7) to read the normal cell array 2, and selects the word line VWL replaced with an address A(24:23) after address translation to read the protection information. The Y predecoder group 30, the page select circuit 31, and the byte select circuit 32 translate the address when the normal cell array 2 is read and when the protection information is read.

In this manner, a portion of a means for selecting the memory cell in the normal cell array 2 is used for selecting the WP cell array 7. The number of the circuits can be reduced.

Second Embodiment

Figure 13:
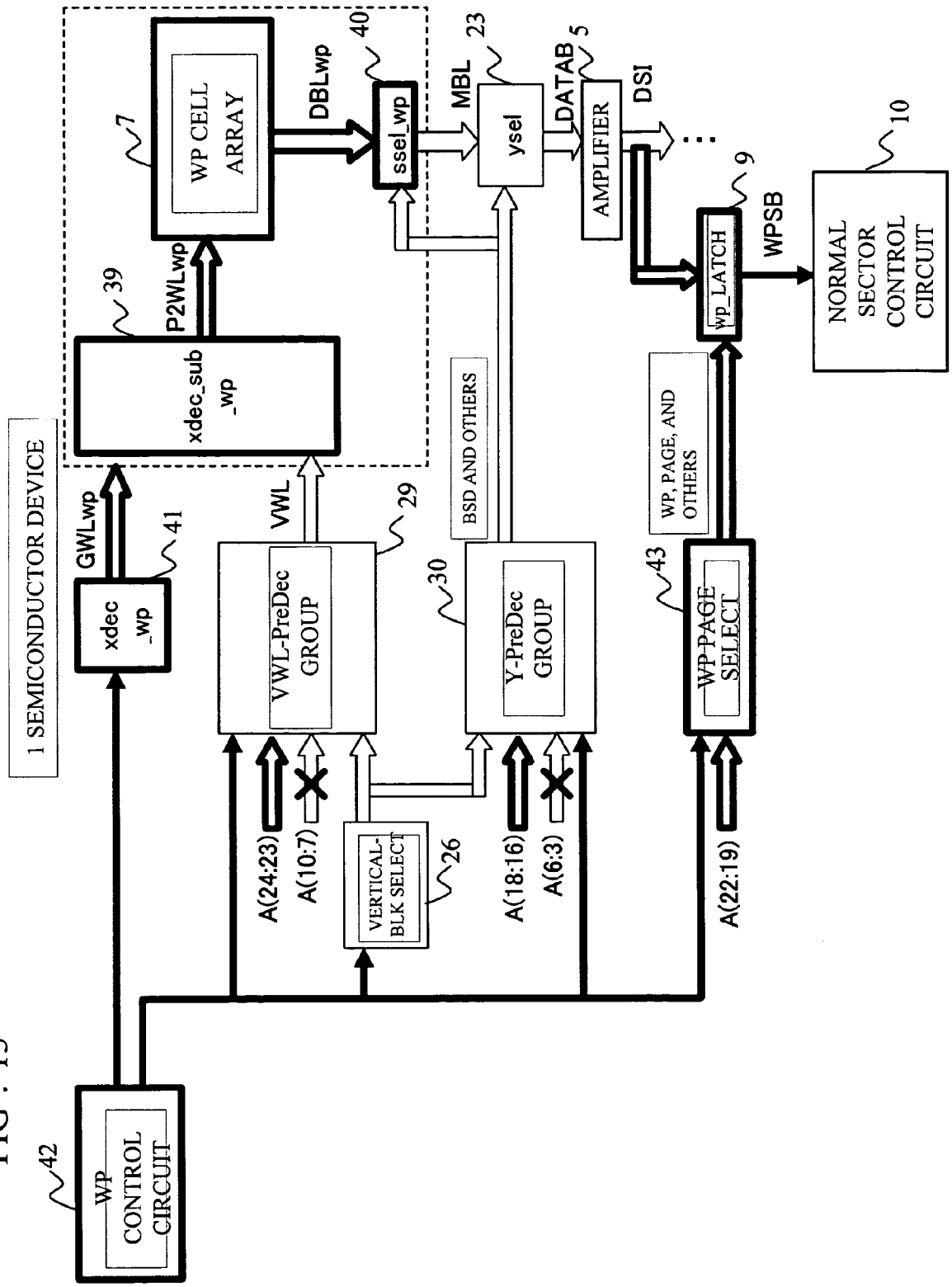
FIG. 13 is a block diagram when the protection information is used internally.

A description will be given of a second embodiment. In the second embodiment, a description will be given of an operation example of the WP cell array having another operation mode. FIG. 13 is a block diagram when the protection information is used internally. FIG. 13 shows a block diagram around the WP cell array when the command is input for erasing or programming a certain normal sector.

As shown in FIG. 13, the semiconductor device 1 includes the WP control circuit 42, the WP cell array 7, the X subdecoder for WP 39, the decoder for WP 40, the Y decoder 23, the amplifier circuit 5, the wp latch circuit 9, the x decoder for wp 41, the vertical block select circuit 26, the VWL predecoder group 29, the Y predecoder group 30, a page select circuit for wp 43, and the control circuit 10. The same components and configurations as described above have the same reference numerals. The thick lines indicate the circuits and signals exclusively used for selecting the WP cell. Except the thick lines, the circuits and signals are used for selecting the normal cells.

The WP control circuit 42 selects the word line GWLwp with the x decoder for wp 41, and further selects the word line VWL with the address signals of A(24) and A(23) in the VWL predecoder group 29. The word line GWLwp and the word line VWL are combined in the X subdecoder for WP 39, and the word line P2WLwp is selected. 2048 WP cells are connected to the selected word line P2WLwp. However, 128 cells alternately arranged from the left are used for storing the protection information, as shown in FIG. 11. That is, the WP cells are connected to even-numbered bit lines out of the bit lines DBLwp0 through DBLwp254.

The data stored there is output to the bit line DBLwp. ⅛ is selected by three address signals of A(18) through A(16) in the Y predecoder group 30, and is transmitted to DATAB. The data is amplified in the amplifier circuit 5. ¹⁄₁₆ is further selected by four address signals of A(22) through A(19) in the page select circuit for WP 43, and is output to the IO(0). The WP information in the latch circuit 9 is transmitted to the control circuit 10.

The control circuit 10 cancels the erase or program operation, if the sector is protected. The control circuit 10 performs erase or program operation, if the sector is not protected.

Third Embodiment

Figure 14:
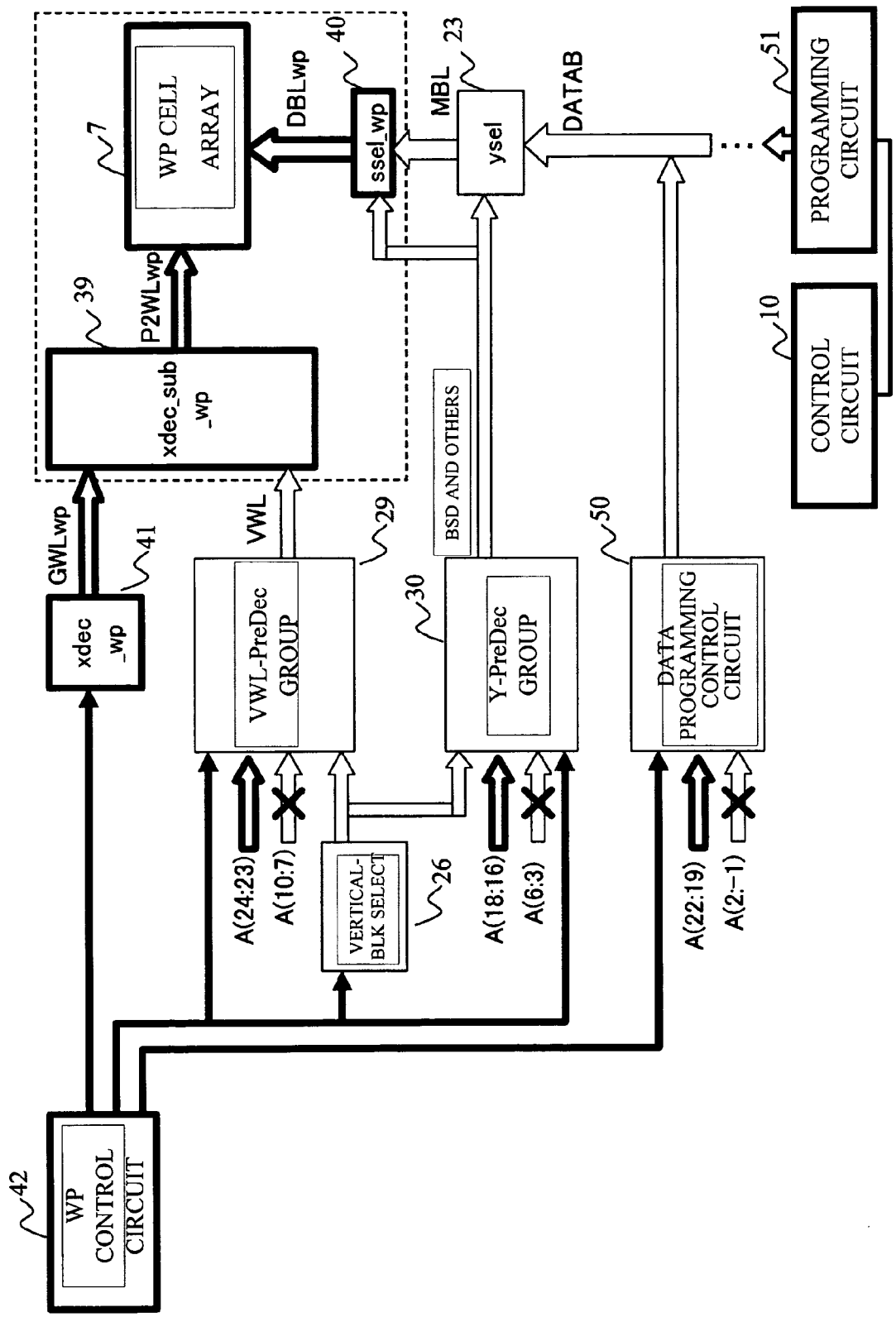
FIG. 14 is a block diagram when the protection information is programmed.

Next, a description will be given of a third embodiment. In the third embodiment, a description will be given of an operation example of the WP cell array having another operation mode. FIG. 14 is a block diagram when the protection information is programmed. FIG. 14 is a block diagram when the command is input for programming the WP cell from the outside.

As shown in FIG. 14, the semiconductor device 1 includes the WP control circuit 42, the WP cell array 7, the X subdecoder for WP 39, the decoder for WP 40, the Y decoder 23, the x decoder for wp 41, the vertical block select circuit 26, the VWL predecoder group 29, the Y predecoder group 30, a programming control circuit 50, the control circuit 10, and a programming circuit 51. The same components and configurations as described above have the same reference numerals. The thick lines indicate the circuits and signals exclusively used for selecting the WP cell In FIG. 14. Except the thick lines, the circuits and signals are used for selecting the normal cells.

The programming circuit 51 is used for programming the protection information in the WP cell array 7. The programming circuit 51 is controlled by the control circuit 10. The programming control circuit 50 is selected by the address A(22) through A(19) in the present mode. The program data is transmitted to the DATAB only corresponding to the IO(0) by the programming circuit 51. Other elements are shared by the control means for programming the data in the normal cell described below.

The program data is selected by the three address signals of A(18) through A(16) in the Y predecoder group 30 to transmit to the bit line MBL. The WP control circuit 42 selects the word line GWLwp in the x decoder for wp 41, and further selects the word line VWL with the address signals of A(24) and A(23) in the VWL predecoder group 29. Both are combined in the X subdecoder for wp 39, and the word line P2WLwp is thus selected. Then, the data is programmed in the WP cell.

Fourth Embodiment

A description will be given of a fourth embodiment. A non-volatile semiconductor memory device generally includes a small number of one-time programmable cell arrays therein, in addition to the normal cell in which erasing and programming can be performed. This is also referred to as OTP (One Time Programmable) cell array. The OTP cell arrays are used so that the user can store the special data and are used for storing the data to protect the WP cell array.

Figure 15:
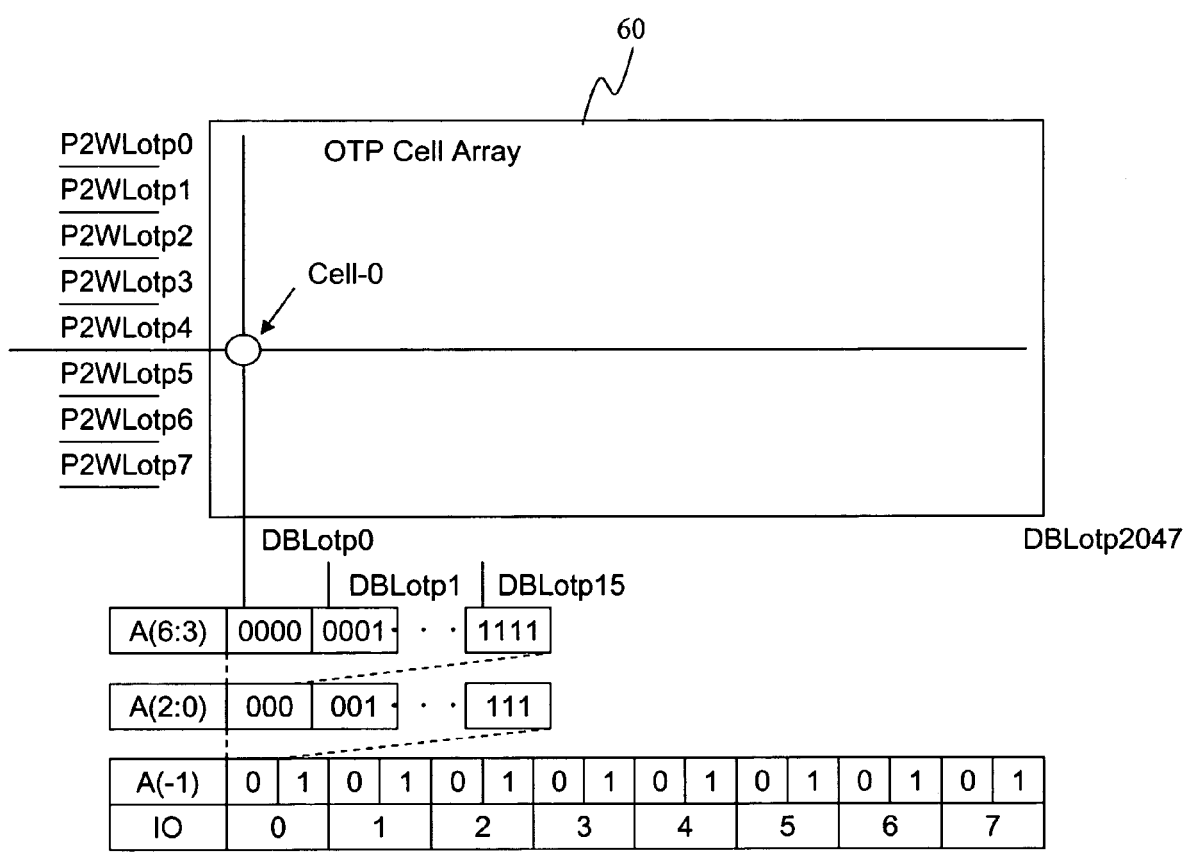
FIG. 15 is a view showing the cell address assignment in the OTP cell array.
Figure 16:
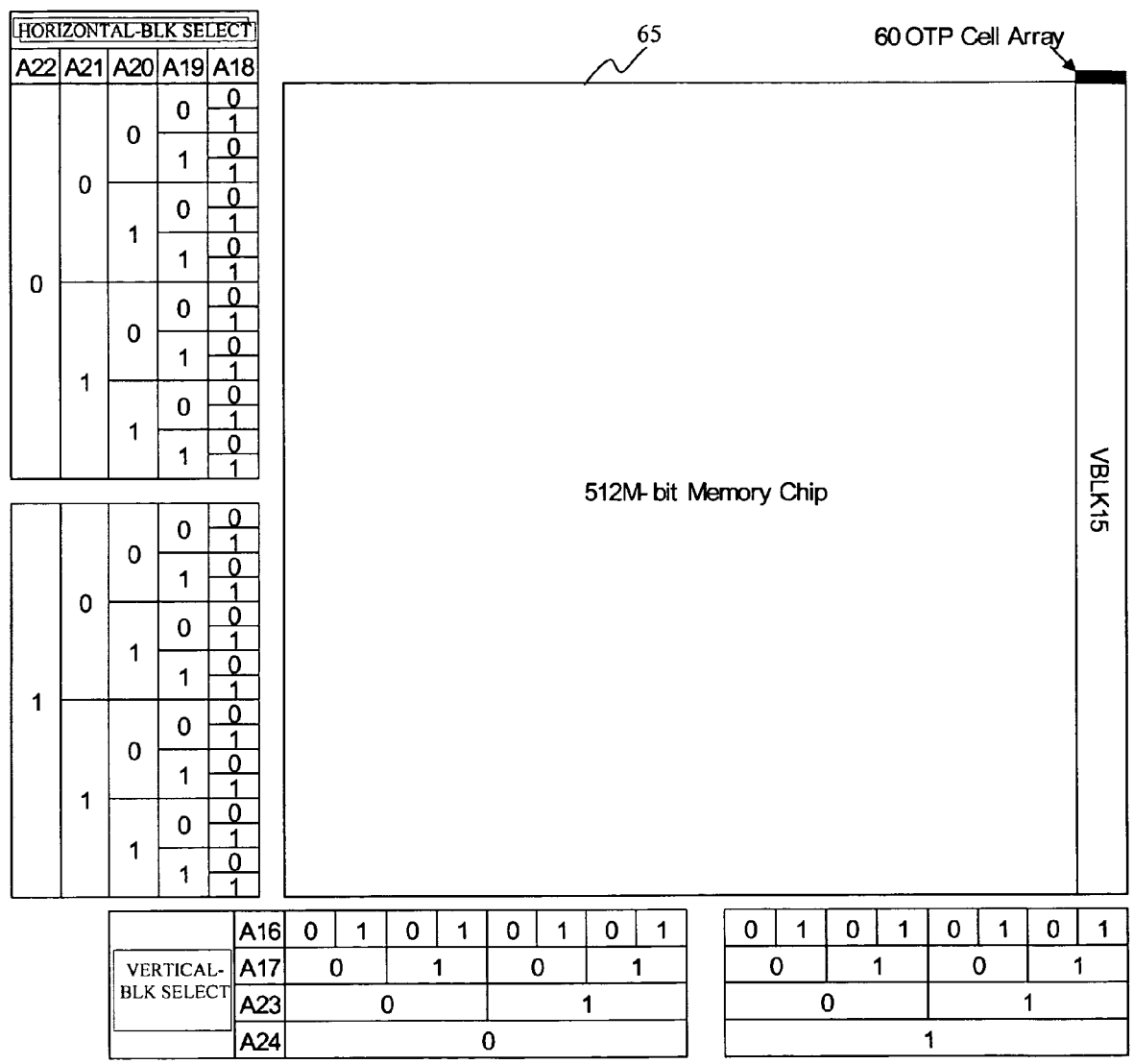
FIG. 16 shows a physical location of the OTP cell array.
Figure 17:
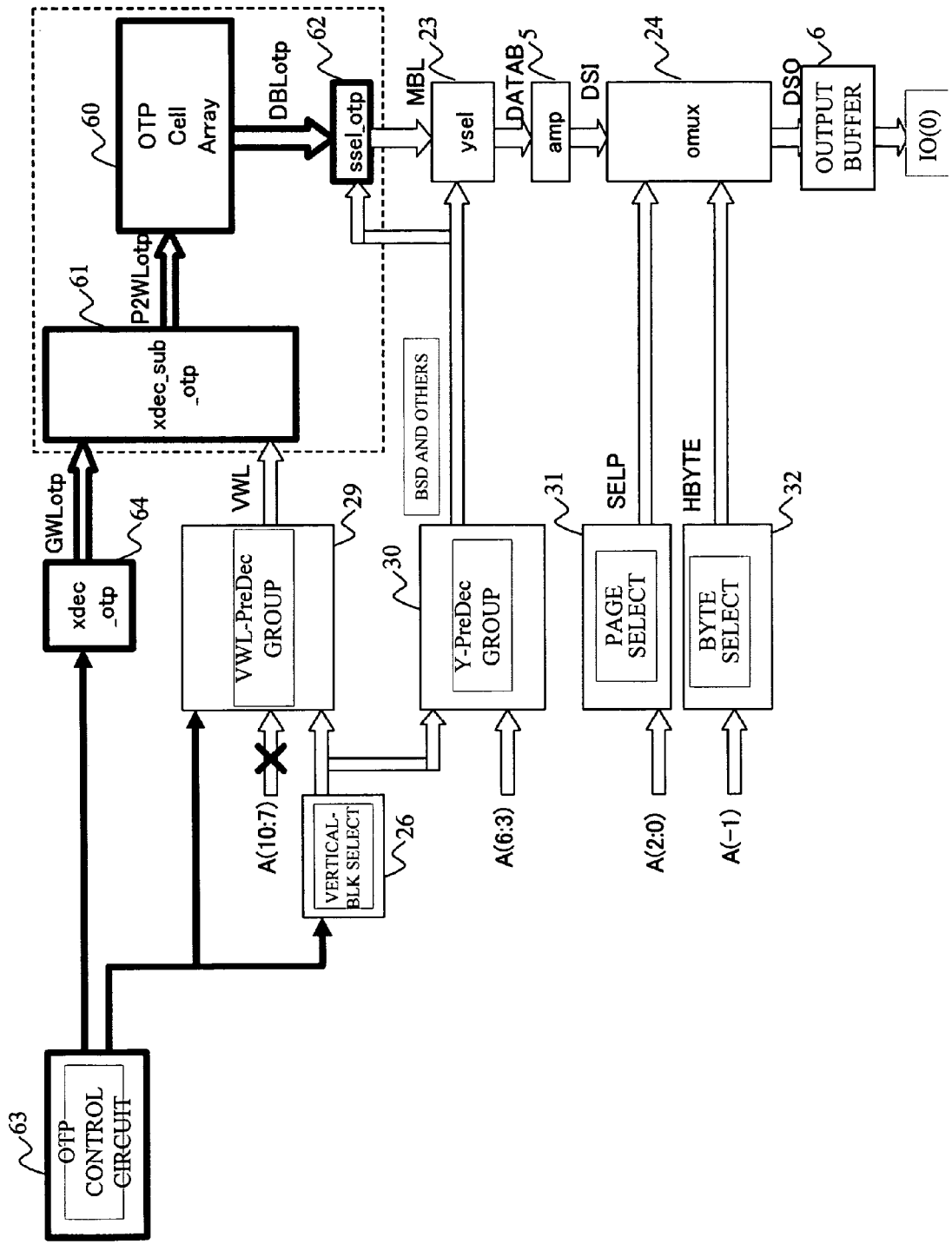
FIG. 17 is a block diagram when the OTP cell array is read.

FIG. 15 is a view showing the cell address assignment in the OTP cell array. FIG. 16 shows a physical location of the OTP cell array. FIG. 17 is a block diagram when the OTP cell array is read. In the present embodiment, as shown in FIG. 16, an OTP cell array 60 is disposed on an upper end of a vertical block VBLK15, which is located adjacently to the WP cell array 7. If the OTP cell array 60 is disposed on the upper end of the vertical block VBLK15 located adjacently to the WP cell array 7, a block diagram for reading the OTP cell is shown in FIG. 17.

Referring to FIG. 17, a semiconductor device 101 includes an OTP cell array 60, an X subdecoder for otp 61, a decoder (ssel_otp) for otp 62, the Y decoder (ysel) 23, the amplifier circuit 5, the omux circuit 24, the output buffer 6, an OTP control circuit 63, an x decoder for otp 64, the vertical block select circuit 26, the VWL predecoder group 29, the Y predecoder group 30, the page select circuit 31, and the byte select circuit 32. The same components and configurations have the same reference numerals. The OTP control circuit 63 selects a word line P2WLotp4 in the x decoder 64 according to the OTP command. The data stream from the bit line MBL to the IO terminal IO(0) is same as the stream in reading the normal cell as described in FIG. 6, including the address signal selection from A(6) to A(−1). The word line P2WLotp is selected by combining the word line GWLotp exclusively used for the OTP cell array in the subdecoder for otp 61 and the word line VWL selected for the OTP cell array.

The GWLotp signal for OTP can be commonly shared by the GWLwp signal for WP. That is, a global word line of WP can be shared by OTP. If any of an OTP cell select mode and a WP cell select mode can select the GWLotp signal, the P2WLwp can be selected with the use of the GWLotp signal instead of the GWLwp signal.

The different vertical blocks are selected in selecting the WP cell and OTP cell, and the word line P2WLotp and the word line P2WLwp are not selected at the same time. Thus, the circuits exclusively used for the WP cell array 7 include only the X subdecoder for wp 39 and the decoder for WP 40, in addition to the WP control circuit 42 and the WP cell array 7, in the block diagram used for reading the protection information shown in FIG. 12. It is thus possible to cut back the number of circuits significantly.

Fifth Embodiment

A description will be given of a fifth embodiment. In the above-mentioned embodiments, the description has been given of the method for storing the protection information in the WP cell array and the method for reading the protection information of each sector from the WP cell array when the given command is input, instead of reading all the sectors at the time of activating the chip and retaining in the latch. Also, the protection information having two bits is used in some cases. The two bits of a non-volatile PPB (Persistent Protection Bit) and a volatile DPB (Dynamic Protection Bit) are used to combine the protection information.

Figure 18:
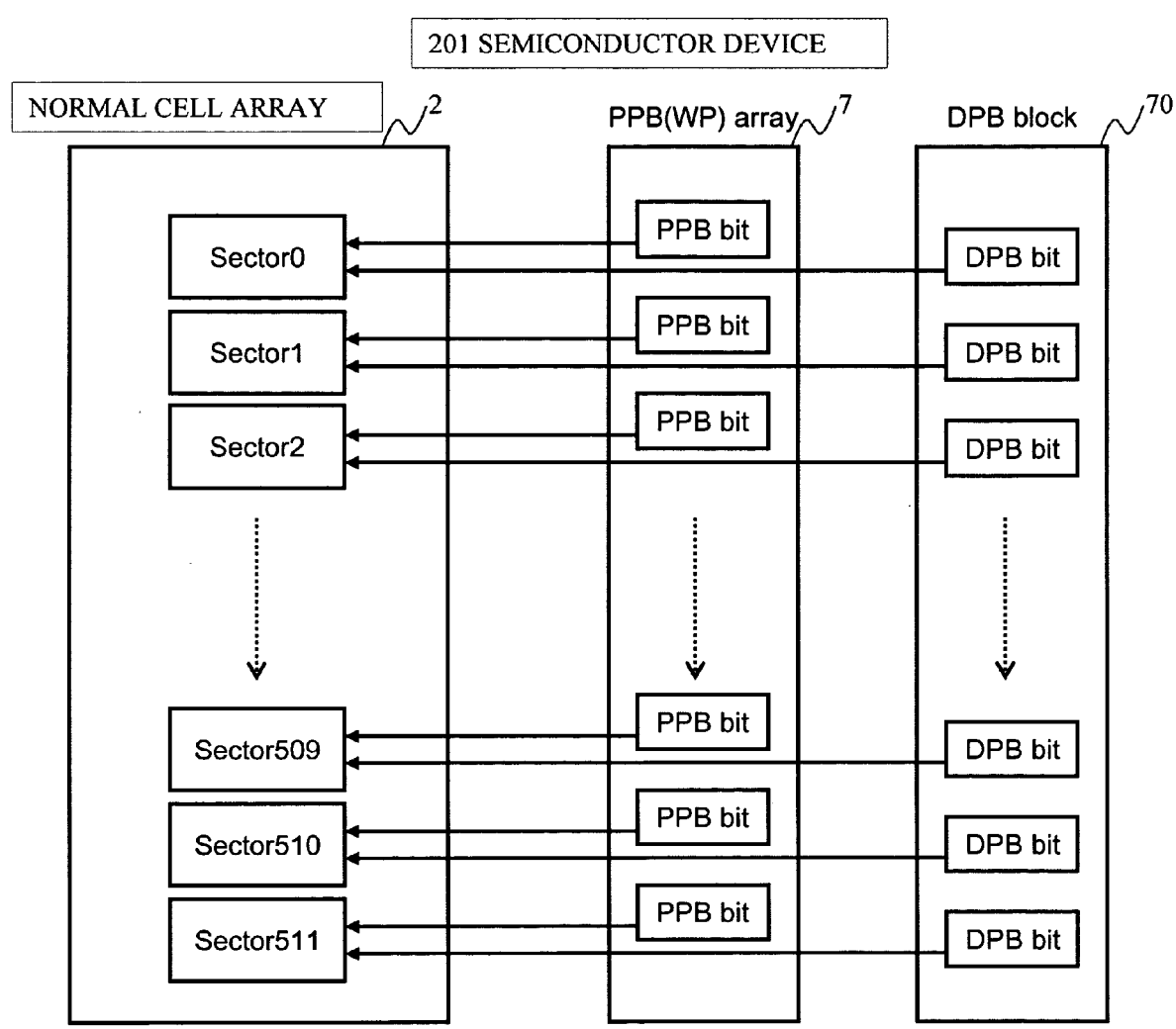
FIG. 18 is a schematic view of a sector protect.

FIG. 18 is a schematic view of a sector protection. As shown in FIG. 18, a semiconductor device 201 includes the normal cell array 2, the WP(PPB) array 7, and a DPB block 70. The same components and configurations as described have the same reference numerals. The normal cell array 2 is divided into 512 sectors. The WP cell array 7 stores the protection information of the respective sectors S0 through S511. The WP cell array 7 is composed of the non-volatile memory cell same as the normal cell array 2.

The DPB block 70 stores the protection information of the respective sectors S0 through S511. The DPB block 70 includes the volatile memory and is composed of a logic circuit. Therefore, the protection information of the DPB block 70 can be read faster than that of the WP cell array 7. The data of OR operation between the protection information of the WP cell array 7 and that of the DPB block 70 determines the protection status (protection or unprotection) of the corresponding sector.

Figure 19:
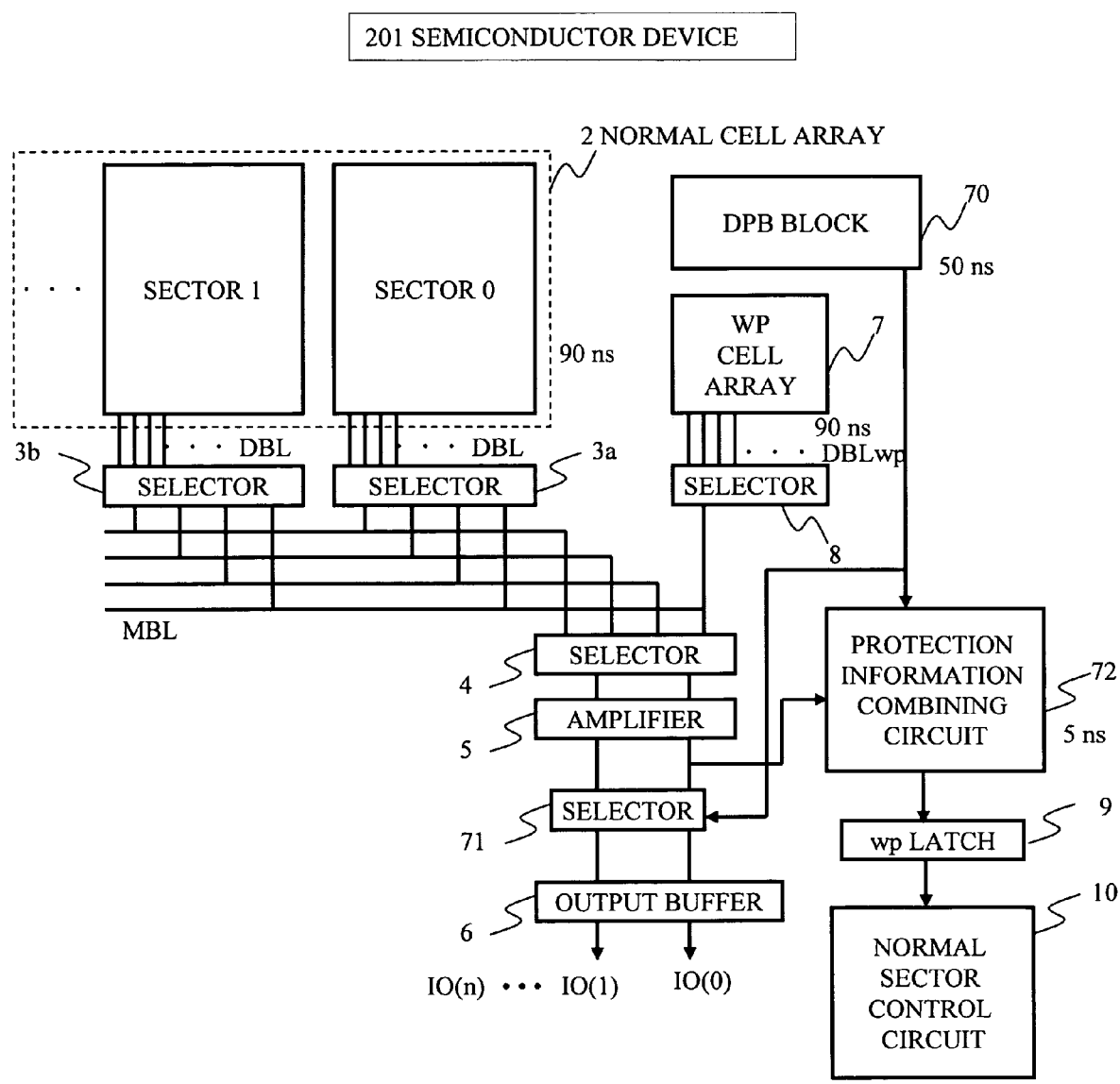
FIG. 19 is a block diagram of the semiconductor device 201 in accordance with a fifth embodiment.

FIG. 19 is a block diagram of the semiconductor device 201 in accordance with the fifth embodiment. As shown in FIG. 19, the semiconductor device 201 includes the memory cell array 2, the selectors 3a through 3n, the selector 4, the amplifier circuit 5, the output buffer 6, the WP cell array 7, the selector 8, the DPB block 70, a protection information combining circuit 72, the WP latch circuit 9, and the control circuit 10. The same components and configurations have the same reference numerals. The data path from the WP cell array 7 to the IO terminal IO is partially shared by the data path from the normal cell array 2 to the IO terminal IO. The WP cell is assigned to a region corresponding to the IO terminal IO to which the protection information is output when the protection information is read.

The data in the normal cell is input into the selectors 3a through 3n by way of the DBL lines in the sector. Then, the data is transmitted to the MBL lines shared by the multiple sectors, and is transmitted to the amplifier circuit 5 by way of the selector 4. The normal cell data amplified in the amplifier circuit 5 is transmitted to the output buffer 6 via the selector 71, and is output from the IO terminals IO(0) and IO(1). Here, it takes, for example, approximately 90 ns to read the data from the normal cell and output the sensed data from the amplifier circuit 5. Then, the data is operated with the logic circuit, and it takes approximately 95 ns in total to output the data from the IO terminal.

When the protection information is read, the protection information stored in the WP cell in the WP cell array 7 is transmitted to the MBL line through the DBLwp line in the WP cell array 7 and the selector. Then, the protection information passes through the same route as the data of the normal cell, and is output from the IO terminal. When the protection information of the WP cell array 7 is internally used, the protection information amplified in the amplifier circuit 5 is input into the protection information combining circuit 72. It takes approximately 90 ns to read the protection information from the WP cell array 7 to the protection information combining circuit 72, which is same as reading the normal cell data.

The DPB block 70 includes the volatile memory to store the protection information of the respective sectors. The protection information stored in the DPB block 70 is input into the protection information combining circuit 72. It takes approximately 50 ns to read the protection information from the DPB block 70 to the protection information combining circuit 72. The protection information combining circuit 72 selectively outputs the protection information of the WP cell array 7 and that of the DPB block 70 to the latch circuit 9.

Next, a description will be given of the protection information combining circuit 72. The WP cell is a non-volatile cell, and it takes the same read time as the normal cell. Therefore, if the protection information of the WP cell array 7 is simply combined with that of the DPB block 70, the time to combine the protection information will be added to the normal read time. Here, it takes, for example, approximately 10 ns to combine the protection information. When the multiple pieces of the protection information are combined and include one having the protection status, the sector of the protection information has to be protected.

In other words, if at least one of the pieces of the protection information is protected, the protection information has to be output as the protection. Therefore, the protection information combining circuit 72 reads the protection information of the WP cell array 7 and the protection information of the DPB block 70 simultaneously, and selectively outputs the protection information of the WP cell array 7 and the protection information of the DPB block 70. It takes, for example, approximately 5 ns that the protection information combining circuit 72 selects and outputs the protection information. Thus, the delay caused by combining can be eliminated. The normal sector control circuit 10 performs erasing or programming according to the protection information latched in the latch circuit 9.

Figure 20:
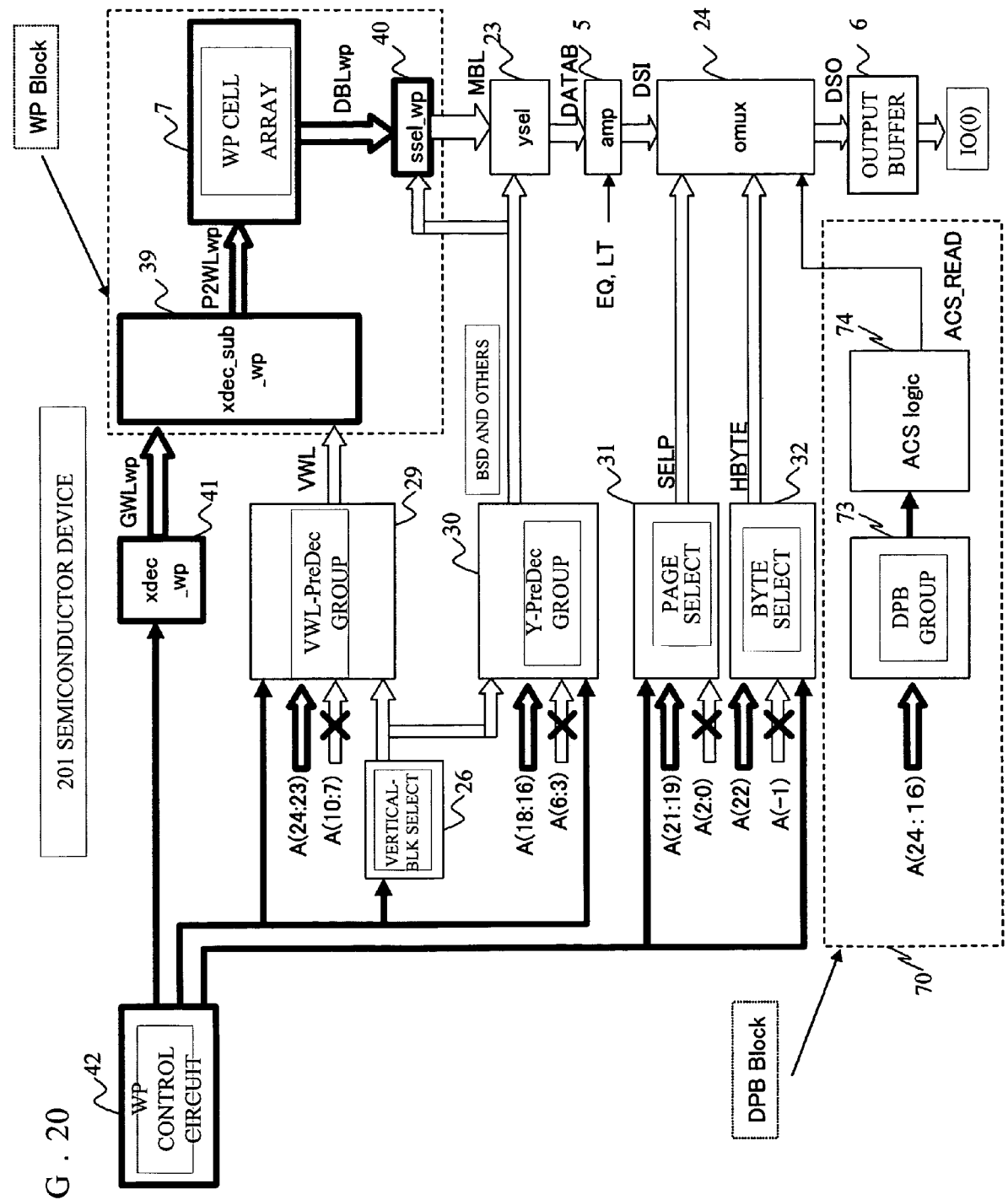
FIG. 20 is a block diagram when the protection information is read in accordance with the fifth embodiment.

FIG. 20 is a block diagram when the protection information is read in accordance with the fifth embodiment. As shown in FIG. 20, the semiconductor device 201 includes the WP control circuit 42, the WP cell array 7, the X subdecoder for WP 39, the decoder for WP 40, the Y decoder 23, the amplifier circuit 5, the omux circuit 24, the output buffer 6, the x decoder for wp 41, the vertical block select circuit 26, the VWL predecoder group 29, the Y predecoder group 30, the page select circuit 31, the byte select circuit 32, and the DPB block 70. The same components and configurations as described have the same reference numerals. The thick lines indicate the circuits and signals exclusively used for selecting the WP cell. Other elements are used for selecting the normal cell.

The DPB block 70 includes a DPB group 73 and an ACS logic circuit 74. The ACS logic circuit 74 extracts one piece of the protection information from the DPB group 73 to output to the omux circuit 24. A signal EQ and a latch pulse signal LT are input into the amplifier circuit 5. The omux circuit 24 corresponds to the protection information combining circuit 72 shown in FIG. 19.

A description will be given of the operation. The protection information of the selected sector is read from the WP cell array 7 in which the non-volatile protection information is stored. It takes time equal to reading the normal cell (for example, approximately 90 ns). At the same time of reading the normal cell, the protection information of the selected sector is read from the DPB block 70. The read time of the DPB group 73 is dramatically fast (approximately 50 ns), as compared to the read time of the WP cell, because the DPB group 73 is a logic circuit.

If the protection information of the DPB group 73 shows the protection status, the omux circuit 24 outputs the protection information to the output buffer 6. Here, it takes 55 ns for the omux circuit 24 from reading to outputting. Thus, there is no delay in reading. On the other hand, if the protection information of the DPB group 73 shows the unprotection status, the omux circuit 24 selectively changes the internal circuit to output the protection information of the WP cell. Here, it takes 95 ns for the omux circuit 24 from reading to outputting. Thus, there is no delay in reading. In addition, only when certain protection information is read in the omux circuit 24, a function of inverting the output is installed.

Figure 21:
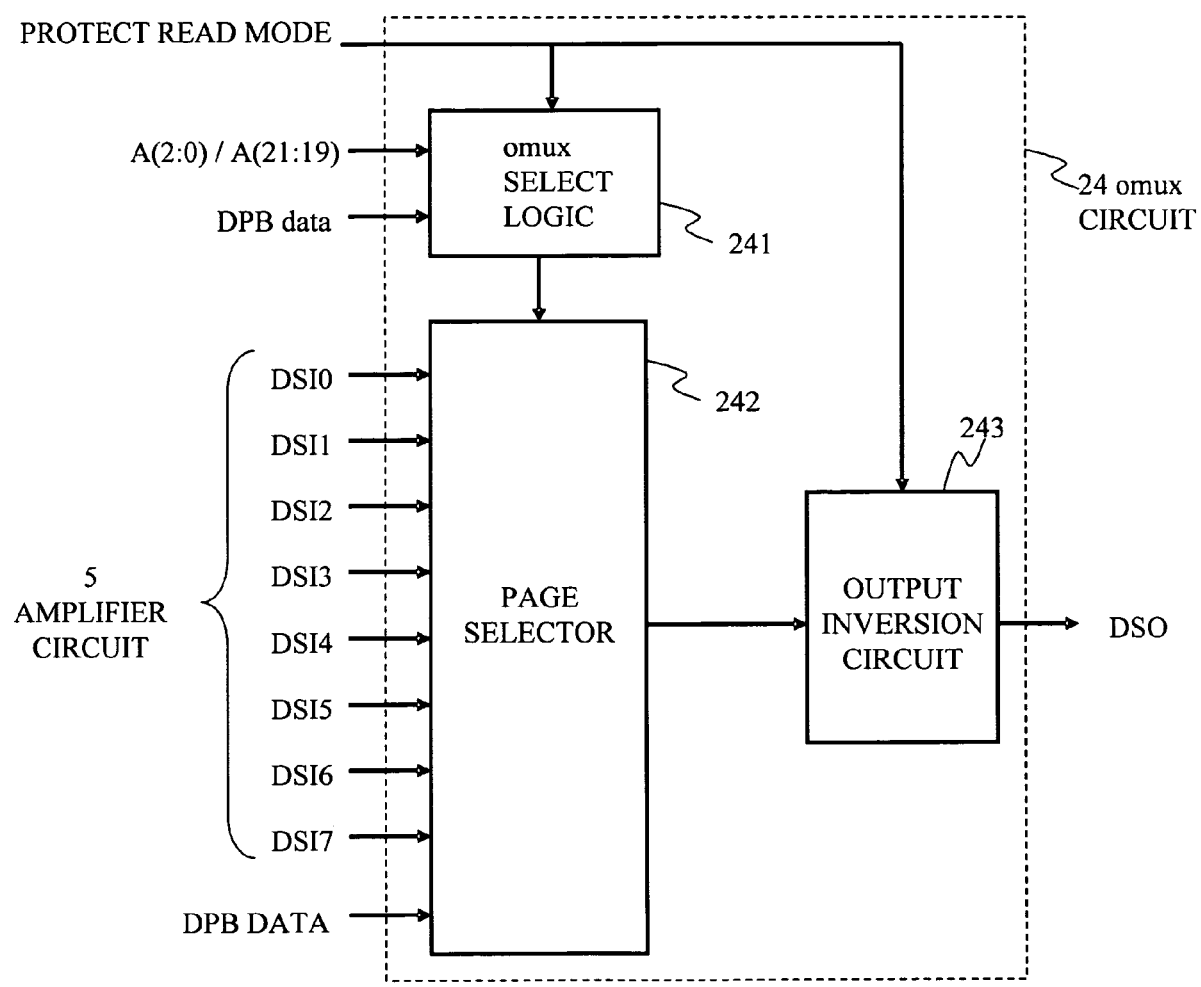
FIG. 21 is a block diagram of an omux circuit.

Next, a description will be given of the omux circuit 24 specifically. FIG. 21 is a block diagram of the omux circuit 24. The omux circuit 24 includes an omux select logic 241, a page selector 242, and an output inversion circuit 243.

DSI0 through DSI7 indicate the outputs from the amplifier circuit 5. DPB data is output from the DPB block 70, and is input into the omux select logic 241 and the page selector 242. When the normal data is read, the DSI0 through DSI7 show the outputs from the amplifier circuit 5. In this product class, one of the eight outputs of the DSI0 through DSI7 is selected to output, and this serves as one output IO.

One of eight, the DSI0 through DSI7, is selected by an address A(2:0) that selects the page address. In the normal reading, the address A(2:0) selects one. If DPB data shows 1 of the protection status, the page selector 242 unconditionally outputs the protection information of the DPB block 70 without waiting for the protection information of the WP cell array 70. If the DPB data shows 0 of the unprotection status, the page selector 242 outputs the protection information of the WP cell array 7. The output inversion circuit 243 inverts the output in the protection mode.

Figure 22:
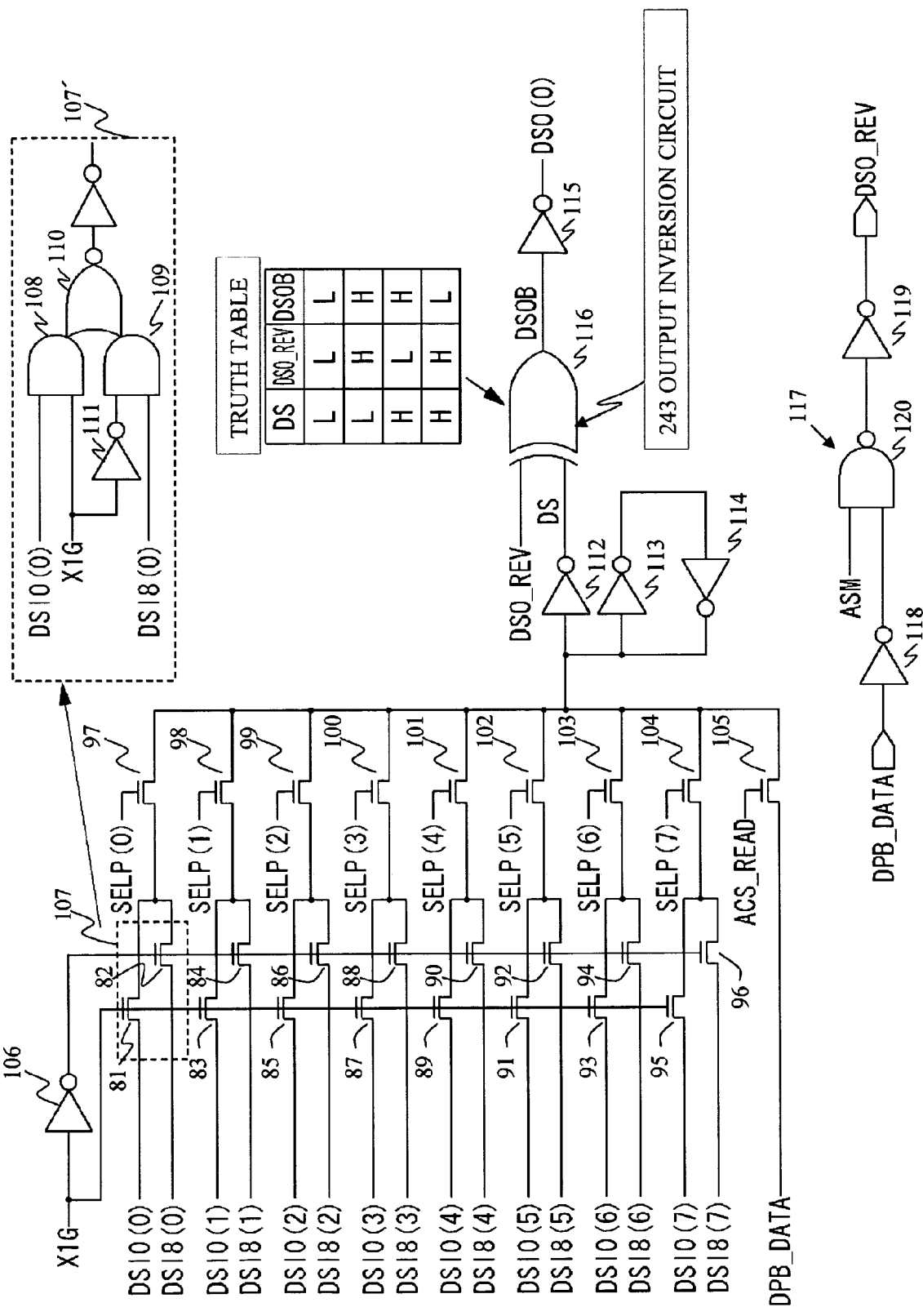
FIG. 22 is a circuit diagram of a page selector in the omux circuit and an output inversion circuit.

FIG. 22 is a circuit diagram of the page selector 242 in the omux circuit 24 and the output inversion circuit 243. The page selector 242 includes NMOS transistors 81 through 105 and an inverter 106.

Gates of the transistors 81, 83, 85, 87, 89, 91, 93, and 95 are controlled by a signal X1G. The signal X1B is a select signal to determine whether the device is used in a word mode (×16) or in a byte mode (×8), and is generated according to the input from an external terminal (not shown). Gates of the transistors 82, 84, 86, 88, 90, 92, 94, and 96 are controlled by an inverted signal that the signal X1G is inverted by the inverter 106. A circuit 107 composed of the transistors 81 and 82 can be replaced by a circuit 107' also shown in FIG. 22. The circuit 107' includes AND circuits 108 and 109, an NOR circuit 110, an inverter 111, and another inverter. The output inversion circuit 243 includes inverters 112 through 115, and an EXOR circuit 116.

FIG. 22 shows a truth table of the EXOR circuit 116. If the protection information from the DPB block 70, which is DPB_DATA, is High (protection), a signal ACS_READ is High, a signal SELP(7:0) is Low, and a signal DS is Low. Here, the signal SELP(7:0) is a page select signal. A signal ASM turns to High in the protection information read mode. Here, a signal DSO_REV generated in a circuit 117 is Low, and an output DSOB of the EXOR circuit 116 is Low and a signal DSO(0) is High. On the other hand, if the protection information DPB_DATA is Low (unprotection), the signal ACS_READ is Low and the signal DSO_REV is High. DSIm (m is 0 or 8), which is the protection information from the WP cell array 7, shows the protection status, when it is Low. A signal DS is an inverted signal of the DSIm in the page selected by the signal SELP(7:0).

If the DSIm, which is the protection information from the WP cell array 7, is Low (protection), the signal DS is High, the signal DSO_REV is High, and the signal DSO(0) is High. If the DSIm, which is the protection information from the WP cell array 7, is High (unprotection), the signal DS is Low, the signal DSO_REV is High, and the signal DSO(0) is Low.

Figure 23:
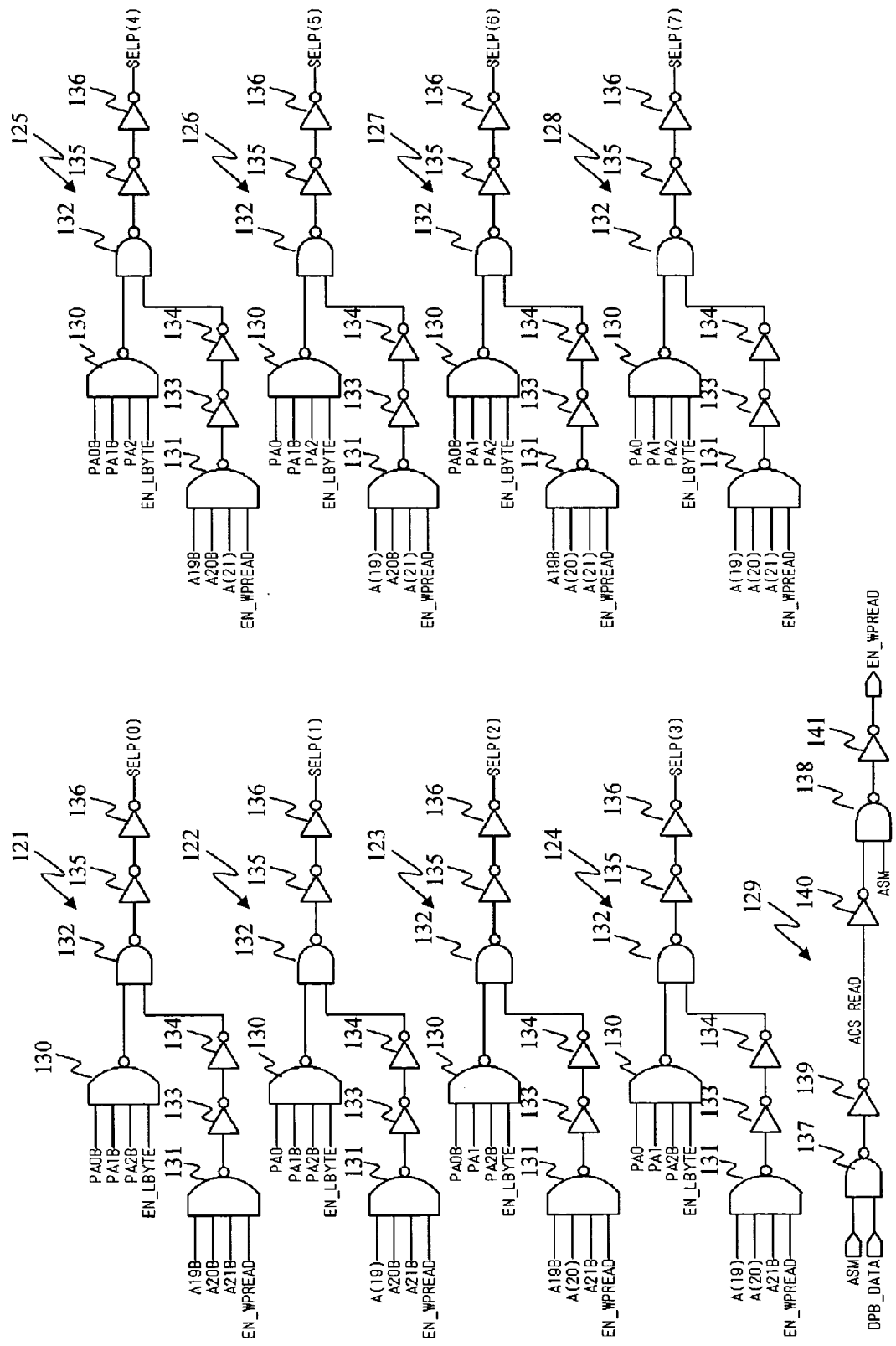
FIG. 23 is a circuit diagram of the omux select logic.

FIG. 23 is a circuit diagram of the omux select logic 241. The omux select logic 241 includes circuits 121 through 129. The circuits 121 through 128 respectively include NAND circuits 130 through 132 and inverters 133 through 136. The circuit 129 includes NAND circuits 137 and 138 and inverters 139 through 141. In the circuit 129, signals ASM and DPB_DATA are input into the NAND circuit 137, and are inverted in the inverter 139. A signal ACS_READ is input into the inverter 140, and then the NAND circuit 138 performs a NAND operation with the signal ASM. A signal EN_WPREAD is output through the inverter 141. In the circuit 129, when the signal DPB_DATA is Low, a signal EN_WPREAD of High is output. The signal EN_WPREAD output from the circuit 129 is input into the NAND circuit 131 of the circuits 121 through 128.

In the circuits 121 through 128, signals PA0B(PA0), PA1B(PA1), PA2B(PA2), and EN_LBYTE are input into the NAND circuit 130. Signals A19B(A19), A20B(A20), A21B (A21), and EN_WPREAD are input into the NAND circuit 131. The NAND circuit 132 performs the NAND operation of the outputs from the NAND circuits 130 and 131, and SELP(0) through SELP(7) are output via the inverter 136. The output signals SELP(0) through SELP(7) of the respective circuits 121 through 128 are output into the gates of the transistors 97 through 105 shown in FIG. 22 to select the output of the page selector 242.

Figure 24:
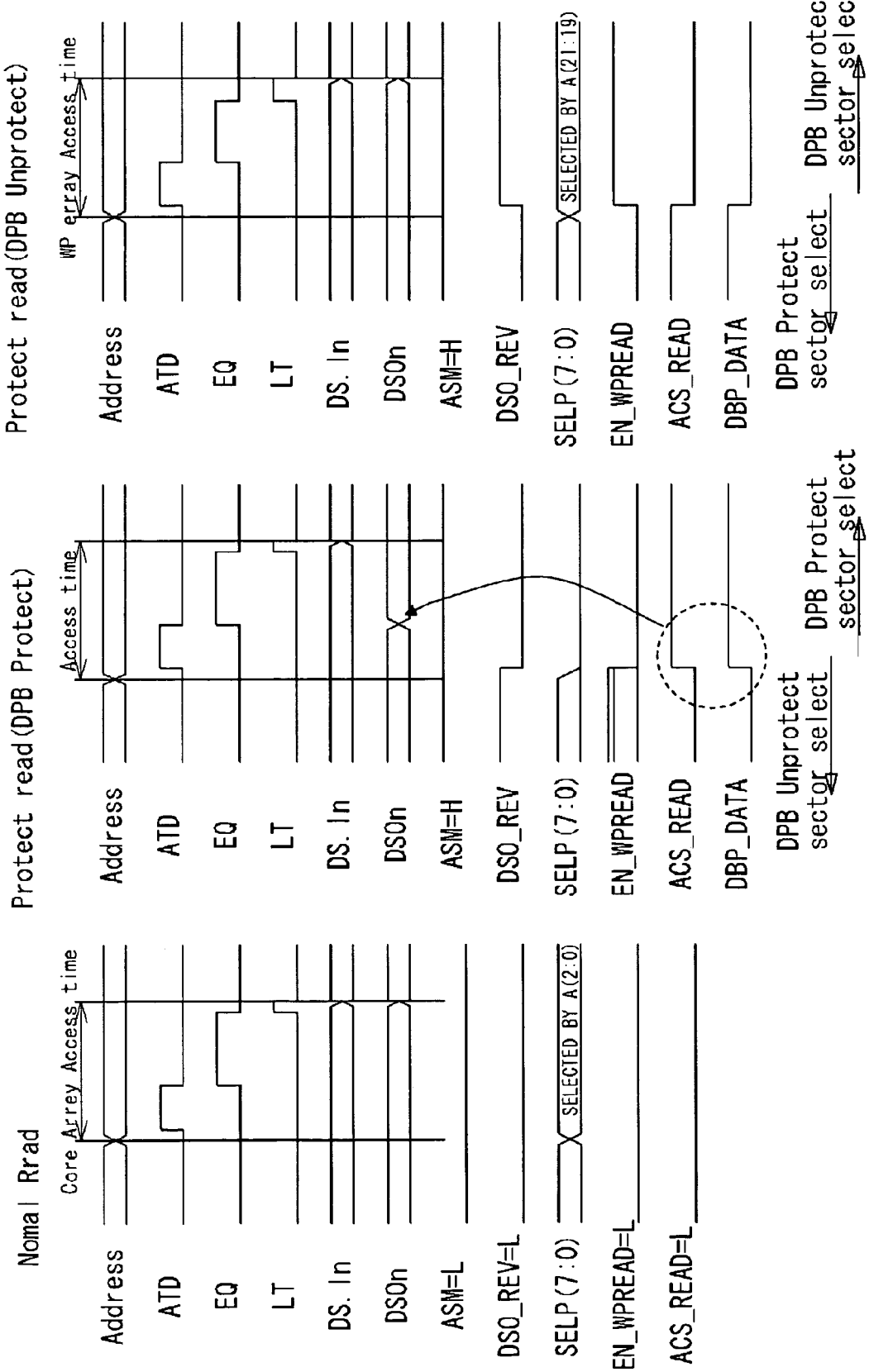
FIG. 24A is a timing chart of the normal reading.
FIG. 24B is a timing chart of the protection reading (DPB protection)
FIG. 24C is a timing chart of the protection reading (DPB unprotection)

FIG. 24A is a timing chart of the normal reading. FIG. 24B is a timing chart of the protection reading (DPB protection). FIG. 24C is a timing chart of the protection reading (DPB unprotection). As shown in FIG. 24A, if the address is changed at the time of normal reading, the cell data is sensed as a trigger of the generating ATD pulse during the EQ pulse and the sensed data is latched by a latch pulse LT.

If the product class has the page mode (page size is eight), eight cell data are simultaneously latched in the amplifier circuit 5 for every I/O. After the LT pulse, one signal SELP becomes High according to the given page select address A(2:0). Thus, the latched cell data is output through the output buffer 6. Consequently, the remaining seven data are continuously output to the outside, by continuously changing A(2:0).

As shown in FIG. 24B, in the Protect read (DPB Protection), a read command of the sector protection information is input, and the signal ASM becomes High. If the sector address of the protection information to be read is input, both the DPB block 70 and the WP cell array 7 start to be read simultaneously. The designated address of the protection information to be read is used to read the DPB of the unprotection status, and if the DPB corresponding to a newly input address has the protection information, the DPB cell can be read immediately. Therefore, if the signal DPB_DATA is High, the output of the NAND circuit 120 is High in the circuit 117 in FIG. 22, the output of the inverter, DSO_REV, is Low. Also, the signal ACS_READ is changed.

In the circuit 129 in FIG. 23, if the signal DPB_DATA is High, the output of the NAND circuit 137 is Low, the output of the NAND circuit 138 is High, and the output EN_WPREAD of the inverter 141 is Low. That is, the protection information of the WP cell array 7 does not have to be read. Here, all the signals SELP are Low. The transistors 97 through 104 are OFF, and the output path is blocked if the WP cell array 7 is blocked. If the DPB is High, the signal DS is Low, the output DSOB of the EXOR circuit 116 is Low. DSO(0) is shown at High immediately.

As shown in FIG. 24C, in the Protect read (DPB unprotection), a read command of the sector protection information is input, and the signal ASM becomes High. If the sector address of the protection information to be read is input, both the DPB block 70 and the WP cell array 7 start to be read simultaneously. The designated address of the protection information to be read is used to read the DPB of unprotection status, and if the DPB corresponding to a newly input address has the unprotection information, the DPB cell can be read immediately. Therefore, if the signal DPB_DATA is Low, the output of the NAND circuit 117 is Low in FIG. 22, the output of the inverter 119, DSO_REV, is High. Also, the signal ACS_READ is changed.

In the circuit 129 in FIG. 23, if the signal DPB_DATA is Low, the output ACS_READ of the inverter 139 is Low, and the output EN_WPREAD of the inverter 141 is High. That is, only the reading of the WP cell array 7 may be output from the DSO. Here, only one SELP is selected from the signals SELP according to the designated address A(21:19) of the WP cell array 7. One of the transistors 97 through 104 in FIG. 22 turns ON.

Then, the memory cell of the WP cell array 7 and the normal read of the normal cell array 2 are sensed in the same operation, and the WP cell data is output from the DSO at the same output timing. Thus, it is possible to make the output timing of the protection information reading same as that of the normal reading.

In accordance with the fifth embodiment, even if the multiple pieces of the protection information are combined, the read time is not delayed by the additional time for combining, as compared to the normal read time. It is thus possible to make the access time of reading the protection information equal to that of the normal reading.

Sixth Embodiment

A description will now be given of a sixth embodiment. In the semiconductor device, the X decoder in the above-mentioned WP cell array 7 is composed of a multiple of a minimum unit of the X decoder in the normal cell array 2. This is because the circuits and the layout are shared to reduce the time for design. Therefore, the WP cell array 7 includes the cells that are used for storing the protection information and the cells that are not used for storing the protection information.

When the user erases the WP cell array 7, all the cells are accessed by the internal circuit, according to the characteristics of the flash memory of erasing at a time. When the user reads and programs, only the cell that stores the protection information is accessed. Conventionally, the method has been proposed for accessing only the cell in which the protection information is stored. In the test, all the cells including the cells that are not used for reading or programming have to be configured accessible. Therefore, the WP cell array 7 is required for including an address translation circuit so that the user may access and the test may be carried out.

Figure 25:
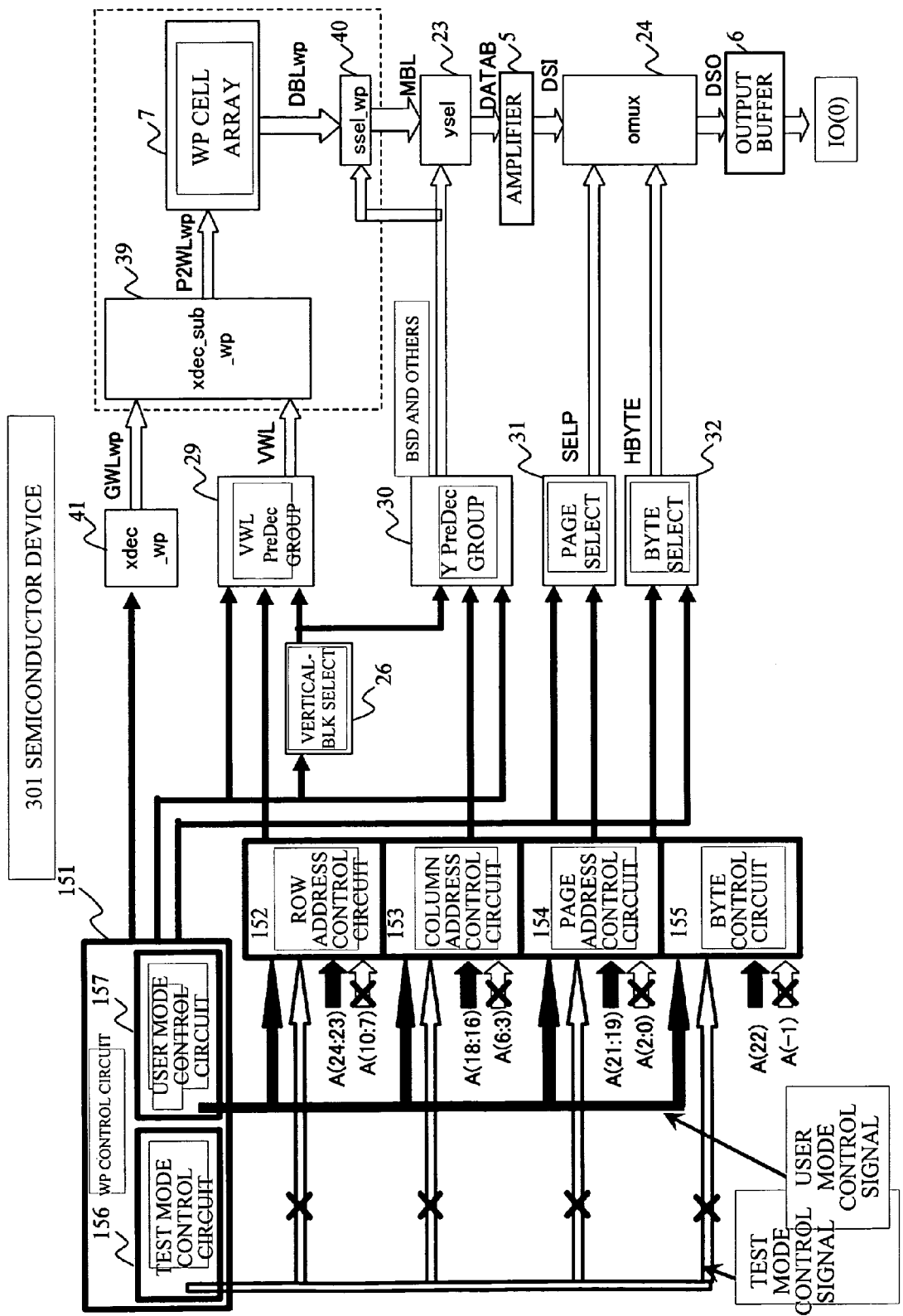
FIG. 25 is a block diagram illustrating the WP cell array to be read by the user.

First, a description will be given of a read operation in the user mode. FIG. 25 is a block diagram illustrating the WP cell array to be read by the user. As shown in FIG. 25, a semiconductor device 301 includes a WP control circuit 151, the WP cell array 7, the X subdecoder for WP 39, the decoder for WP 40, the Y decoder 23, the amplifier circuit 5, the omux circuit 24, the output buffer 6, the x decoder for wp 41, the vertical block select circuit 26, the VWL predecoder group 29, the Y predecoder group 30, the page select circuit 31, and the byte select circuit 32, a row address control circuit 152, a column address control circuit 153, a page address control circuit 154, and a byte control circuit 155.

The same components and configurations have the same reference numerals. The row address control circuit 152, the column address control circuit 153, the page address control circuit 154, and the byte control circuit 155 correspond to an address control circuit in the scope of claims. The address control circuit translates the address used in the used mode and the test mode so as to change an accessible region of the memory cell in the WP cell array 7. The WP control circuit 151 includes a test mode control circuit 156 and a user mode control circuit 157.

The user mode control circuit 15, after a user command is input, outputs a user mode control signal to the row address control circuit 152, the column address control circuit 153, the page address control circuit 154, and the byte control circuit 155 so as to selectively change the address used for the address control circuit. Therefore, the address for selecting the WP cell is the sector address A(24:16). The test mode control circuit 156 does not output the test mode control signal when the user command is input.

Next, a description will be given of the configuration of the WP cell array. FIG. 26 shows a configuration example of the WP cell array 7. As shown in FIG. 26, there are Not Used cells and the WP cell that store the protection information in the WP cell array 7. In this example, the WP cell exists in the IP(0) and IO(8) on the WP cell array 7. The user can access only the WP cell in the WP cell array 7 to read and program the WP cell array 7. Also, in the test, all the cells in the WP cell array 7 (WP cells and Not Used cells) have to be accessible.

The WP cell array 7 is composed of eight word lines, which is the minimum unit of the X decoder. The Y decoder has the same configuration as the normal sector. Therefore, the WP cell array 7 is composed of 2048 bit lines. The number of the WP cells is equal to the number of the sectors. Here, the number of the sectors is 512, and 512 cells are used as the WP cells. Other cells are not used cells, and so the user is not accessible to read and program.

Referring back to FIG. 25, when the user reads the WP cell, the sector address is selected. After the user inputs the command, the user mode control circuit 157 outputs the user mode control signal to the row address control circuit 152, the column address control circuit 153, the page address control circuit 154, and the byte control circuit 155. The address for selecting the WP cell is the sector address A(24:16).

On the other hand, decoding the normal cell uses a the row address A(10:7) for selecting the word line VWL, the column address A(6:3) for selecting the BSD and others, the page address A(2:0) for selecting the page, and the byte select address A(−1) for selecting the byte. The sector address is used for decoding the WP cell array 7. Therefore, the row address A(24:23), the column address A(18:16), the page address A(21:19), and the byte select address A(22) are used.

The WP cell of the present embodiment shown in FIG. 26 exists in the IO(0) and IO(8) on the WP cell array 7. At the time of user's reading, the byte is selected according to the byte select address A(22), and the data is output to the IO(0) only. Here, a predetermined value, for example, 0 is output to another IO (15:1), based on the specification.

Figure 27:
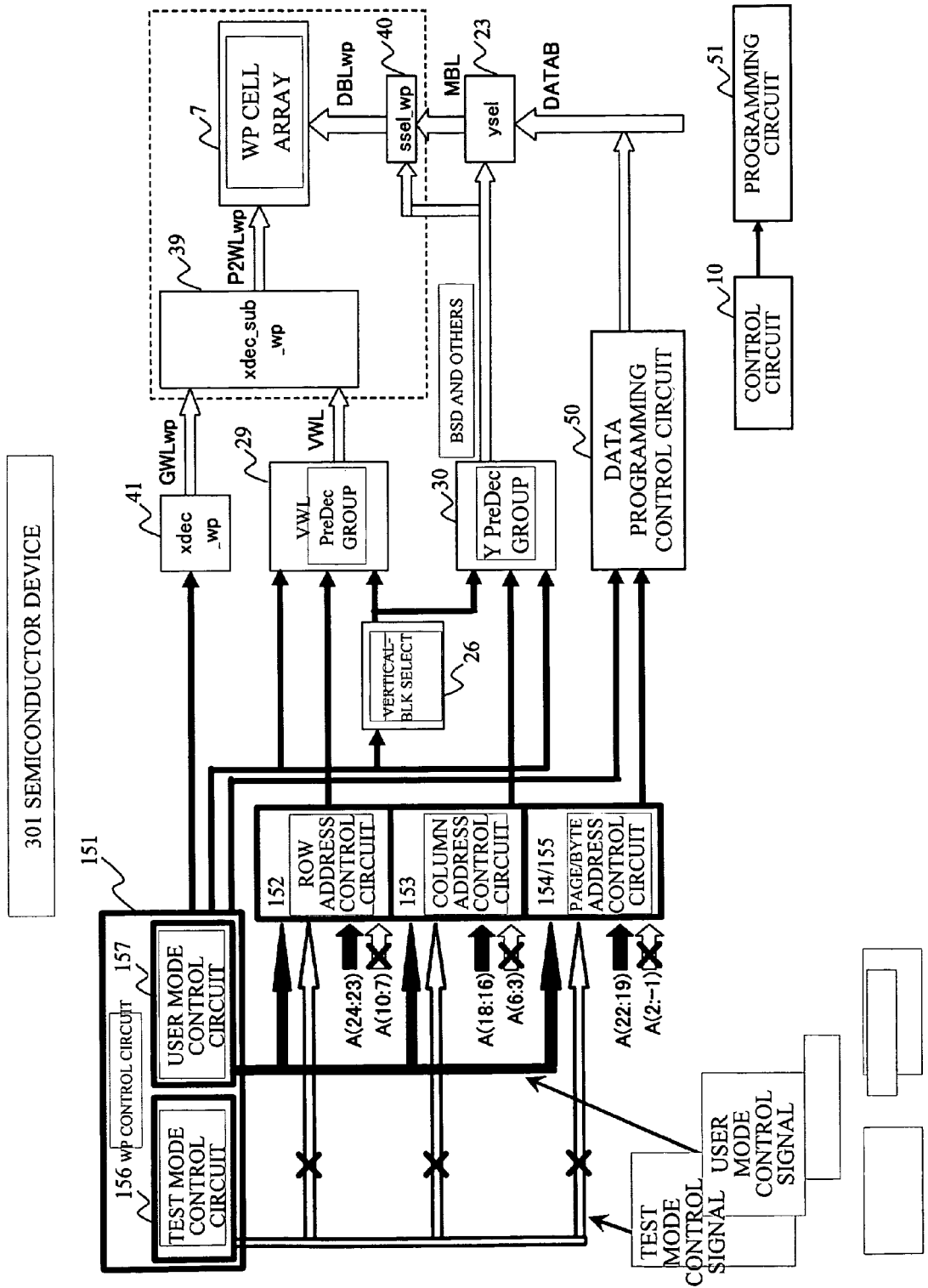
FIG. 27 is a block diagram illustrating when the WP cell array is programmed so that the user may store the protection information.

A description will be given of the programming operation in the user mode. FIG. 27 is a block diagram illustrating when the WP cell array 7 is programmed so that the user may store the protection information. As shown in FIG. 27, the semiconductor device 301 includes the WP control circuit 151, the WP cell array 7, the X subdecoder for WP 39, the decoder for WP 40, the y decoder 23, the x decoder for wp 41, the vertical block select circuit 26, the VWL predecoder group 29, the Y predecoder group 30, the programming circuit 50, the control circuit 10, the programming circuit 51, the row address control circuit 152, the column address control circuit 153, the page address control circuit 154, and the byte control circuit 155.

When the user programs the WP cell in the WP cell array 7, the WP cell is selected by the sector address. The user mode control circuit 157, after the user inputs the command, outputs a user mode control signal to the row address control circuit 152, the column address control circuit 153, the page address control circuit 154, and the byte control circuit 155. Thus, the address for selecting the WP cell in the WP cell array 7 is configured to be the sector address A(24:16).

The sector address is used for decoding the WP cell array 7. Therefore, the row address A(24:23), the column address A(18:16), the page address A(21:19), and the byte select address A(22) are used. The data programming circuit 50 programs with the signal line DATAB corresponding to the WP cell IO(0) selected by the address A(22:19). In other parts, programming is performed with the same control means as programming the normal sector. The test mode control circuit 156 does not output the test mode control signal when the user command is input.

Next, a description will be given of the reading and programming in the test mode. Only the WP cell in the WP cell array 7 is accessible in reading and programming with the user command. In the test mode, not used cells in the WP cell array 7 are required to be accessed, in addition to the WP cells. Therefore, after the test command is input, the test mode control signal decodes the cells in the WP cell array 7 with the same address as that of the normal sector.

Figure 28:
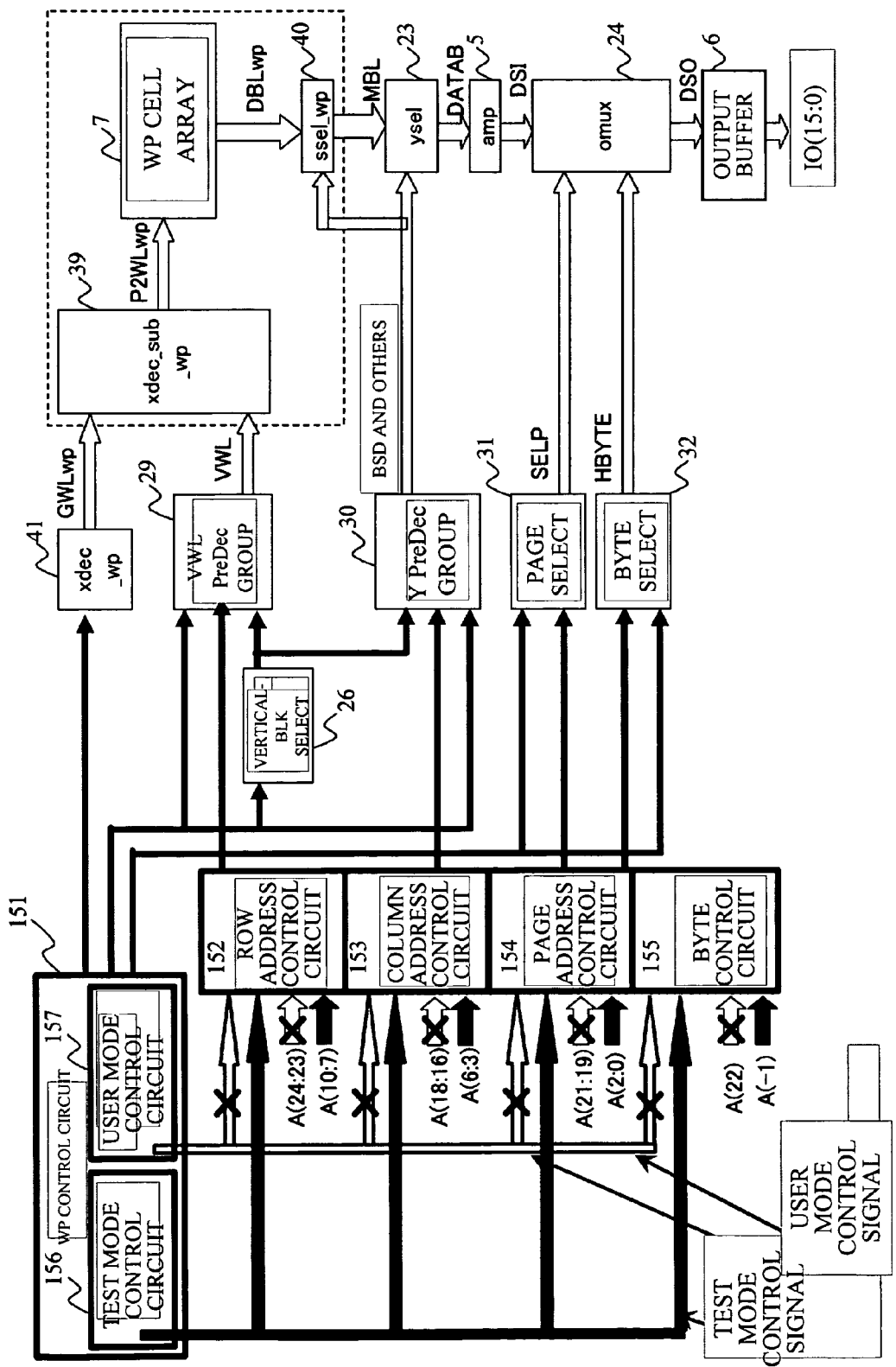
FIG. 28 is a block diagram when the WP cell array is read in a test mode.

FIG. 28 is a block diagram when the WP cell array 7 is read in the test mode. The same components and configurations have the same reference numerals. The test mode control circuit 156, after the test command is input, outputs the test mode control signal to the respective address translation circuits. The test mode control circuit 156, after a WP cell array test command is input, outputs the test mode control signal to the row address control circuit 152, the column address control circuit 153, the page address control circuit 154, and the byte control circuit 155 so as to translate the address to be used in the address control circuit. It is thus possible to read all the cells in the WP cell array 7, by selecting the cell with the address (10:−1) same as that of reading the normal sector, regardless of the WP cell or the not used cell.

In the user mode, the data output is controlled by the IO(0) in the omux circuit 24 and the control signal thereof. In the test mode, the omux circuit 24 and the control signal thereof are same as reading the normal sector, and the data is output to the IO (15:0). The user mode control circuit 157 does not output the user mode control signal, when a WP cell array test command is input.

Figure 29:
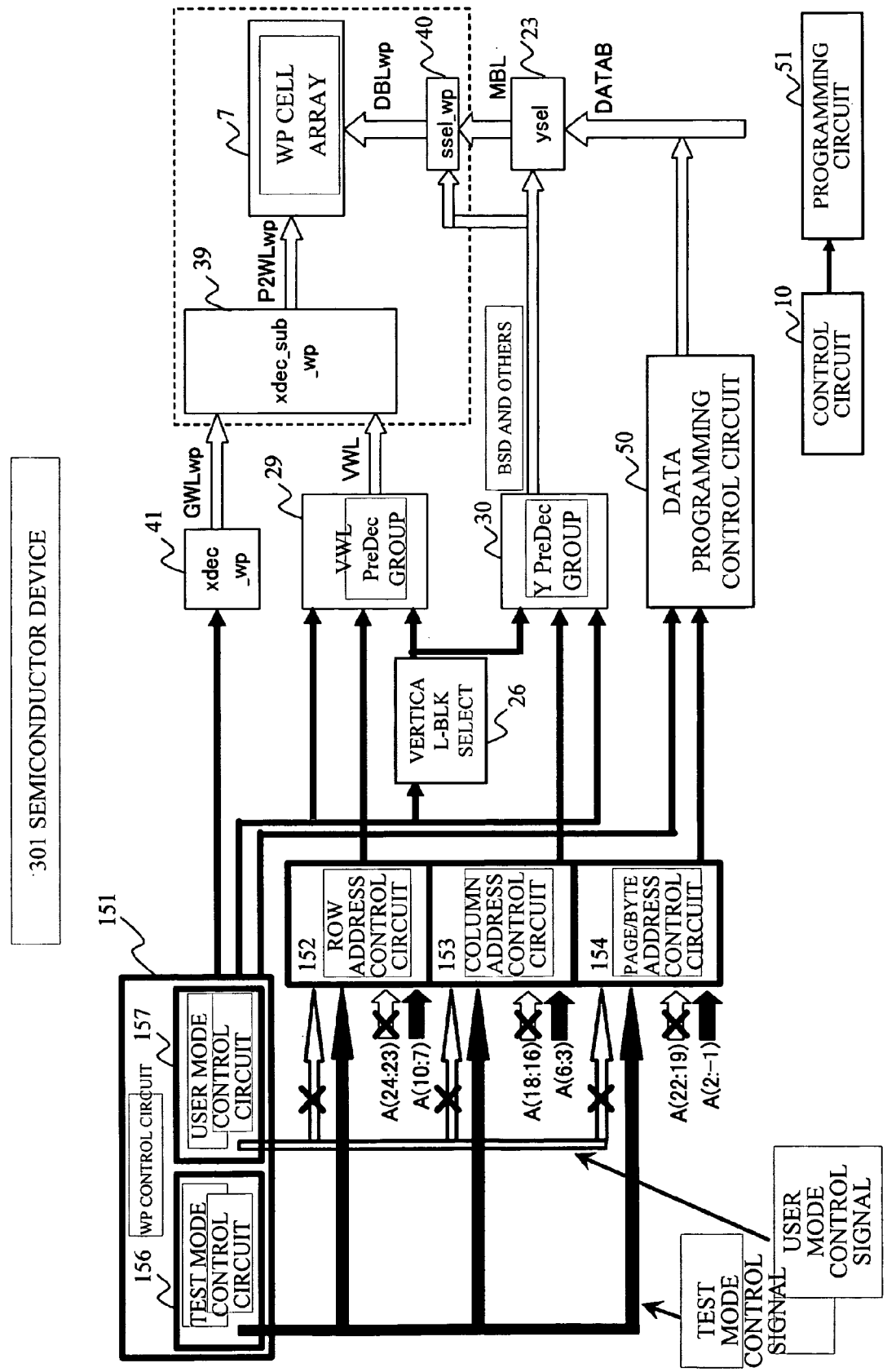
FIG. 29 is a block diagram when the WP cell array is programmed in the test mode.

Next, a description will be given of the programming operation in the WP cell array. FIG. 29 is a block diagram illustrating when the WP cell array is programmed in the test mode. The same components and configurations as described above have the same reference numerals. Same as reading, the test mode control circuit 156, after the WP cell array test command is input, outputs the test mode control signal to the row address control circuit 152, the column address control circuit 153, the page address control circuit 154, and the byte control circuit 155. It is thus possible to program all the cells in the WP cell array 7, with the address (10:−1) same as that of programming the normal sector.

The data programming control circuit 50 is controlled by the A(2:−1) same as programming the normal sector. The cell in the selected cell array 7 is programmed by the DATAB followed by the IO corresponding to the cell to be programmed. Also, various test modes of the WP cell array 7 are performed by the circuit control and address decoding same as the test mode of the normal sector. The user mode control signal and the test mode control signal correspond to the control signal that changes the address used in the address control circuit.

In accordance with the sixth embodiment, the memory cell in the WP cell array 7 is selected with the address for selecting the sector in the normal cell array 2 in the user mode. It is thus possible to access the memory cell array that stores only the protection information of the sector in a second memory cell array. Moreover, the memory cell in the WP memory cell array 7 is selected with the address for selecting the memory cell in the normal sector array 2 in the test mode. It is thus possible to access all the memory cells in the WP cell array 7.

The normal cell array 2, the WP cell array 7, the OTP cell array 60, and the omux circuit 24 (the protection information combining circuit 72) respectively correspond to a first memory cell array, a second memory cell array, a third memory cell array, and a circuit part in the scope of claims.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   a first memory cell array that includes memory cells for storing data and is managed on a sector basis;
   a second memory cell array including memory cells storing sector protection information on the sector basis; and
   a control circuit checking the sector protection information stored in the second memory cell array when a sector is to be modified, wherein the control circuit delays the timing of polling when reading the sector protection information from the second memory cell array.

2. The semiconductor device as claimed in claim 1, wherein the control circuit performs erasing on the basis of the sector protection information read from the second memory cell array.

3. The semiconductor device as claimed in claim 1, further comprising an output terminal, wherein a route from the second memory cell array to the output terminal has a portion shared by a route from the first memory cell array to the output terminal.

4. The semiconductor device as claimed in claim 1, wherein the memory cells of the second memory cell array are assigned to a domain corresponding to a terminal via which the sector protection information is output to an outside of the semiconductor device.

5. The semiconductor device as claimed in claim 1, wherein the second memory cell array is disposed on an extension of a sector array of the first memory cell array.

6. The semiconductor device as claimed in claim 5, further comprising signal lines for selecting memory cells in the first memory cell array, and the signal lines include a signal line used to select one of the memory cells in the second memory cell array.

7. The semiconductor device as claimed in claim 5, further comprising means for selecting memory cells in the first memory cell array, wherein the means for selecting includes a circuit used to select one of the memory cells in the second memory cell array.

8. The semiconductor device as claimed in claim 1, further comprising a write circuit that writes data into the memory cells of the second memory cell array.

9. The semiconductor device as claimed in claim 1, wherein a third memory cell array including one-time programmable memory cells.

10. The semiconductor device as claimed in claim 9, wherein the third memory cell array is disposed on an extension of a sector array of the first memory cell array.

11. The semiconductor device as claimed in claim 10, wherein the third memory cell array is provided on a sector array different from that of the second memory cell array.

12. The semiconductor device as claimed in claim 9, further comprising signal lines for selecting memory cells of the first memory cell array, wherein the signal lines include a signal line used to select one of the one-time programmable memory cells of the third memory cell array.

13. The semiconductor device as claimed in claim 9, comprising means for selecting memory cells in the first memory cell array, wherein the means for selecting includes a circuit used to select one of the one-time programmable memory cells in the third memory cell array.

14. The semiconductor device as claimed in claim 1, wherein the semiconductor device is a semiconductor memory device.

15. A semiconductor device comprising:
a first memory cell array that includes memory cells for storing data and is managed on a sector basis;
a second memory cell array including memory cells storing sector protection information on the sector basis; and
a control circuit checking the sector protection information stored in the second memory cell array when a sector is to be modified, wherein a third memory cell array includes one-time programmable memory cells, further comprising global word lines shared by selection of the memory cells in the second memory cell array and selection of one of the one-time programmable memory cells in the third memory cell array.

16. A semiconductor device comprising:
a first memory cell array that includes memory cells for storing data and is managed on a sector basis;
a second memory cell array including memory cells storing sector protection information on the sector basis; and
a control circuit checking the sector protection information stored in the second memory cell array when a sector is to be modified, further comprising:
a volatile memory circuit storing another sector protection information on the sector basis; and
a circuit part selectively outputting the sector protection information in the second memory cell array and said another sector protection information in the volatile memory circuit.

17. The semiconductor device as claimed in claim 16, wherein the circuit part selects said another sector protection information in the volatile memory circuit when said another sector protection information shows protection of data in the first memory cell array.

18. The semiconductor device as claimed in claim 17, wherein the circuit part selects the sector protection information in the second memory cell array when said another sector protection information in the volatile memory circuit shows unprotection of data in the first memory cell array.

19. The semiconductor device as claimed in claim 16, wherein the circuit part comprises an output inversion circuit that inverts the sector protection information selected.

20. A semiconductor device comprising:
a first memory cell array that includes memory cells for storing data and is managed on a sector basis;
a second memory cell array including memory cells storing sector protection information on the sector basis; and
a control circuit checking the sector protection information stored in the second memory cell array when a sector is to be modified, further comprising an X decoder for the first memory cell array and an X decoder for the second memory cell array, wherein the X decoder for the second memory cell array is configured so as to have a multiple of a minimum unit of the X decoder for the first memory cell array.

21. The semiconductor device as claimed in claim 20, further comprising an address control circuit producing different addresses in a user mode and a test mode so that a domain of the memory cells of the second memory cell array can be changed.

22. The semiconductor device as claimed in claim 21, wherein the address control circuit selects, in the user mode, one of the memory cells of the second memory cell array using an address for selecting one of the sectors of the first memory cell array.

23. The semiconductor device as claimed in claim 21, wherein the address control circuit selects, in the test mode, one of the memory cells of the second memory cell array using an address for selecting one of the sectors of the first memory cell array.

24. The semiconductor device as claimed in claim 21, further comprising a control circuit that provides the address control circuit with a control signal for switching the address used in the address control circuit after receiving a given user command.

25. The semiconductor device as claimed in claim 21, further comprising a control circuit that provides the address control circuit with a control signal for switching the address used in the address control circuit after receiving a given test command.

* * * * *